United States Patent
Kimizuka et al.

(10) Patent No.: US 11,776,103 B2
(45) Date of Patent: Oct. 3, 2023

(54) SYSTEM FOR DERIVING ELECTRICAL CHARACTERISTICS AND NON-TRANSITORY COMPUTER-READABLE MEDIUM

(71) Applicant: Hitachi High-Tech Corporation, Tokyo (JP)

(72) Inventors: Heita Kimizuka, Tokyo (JP); Natsuki Tsuno, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 176 days.

(21) Appl. No.: 16/885,727

(22) Filed: May 28, 2020

(65) Prior Publication Data

US 2021/0027455 A1 Jan. 28, 2021

(30) Foreign Application Priority Data

Jul. 25, 2019 (JP) .................................. 2019-136567

(51) Int. Cl.
  G06T 7/00 (2017.01)
  H01J 37/28 (2006.01)
  H01J 37/22 (2006.01)

(52) U.S. Cl.
  CPC .......... *G06T 7/0004* (2013.01); *H01J 37/222* (2013.01); *H01J 37/28* (2013.01);
  (Continued)

(58) Field of Classification Search
  CPC ......... G06T 7/0004; G06T 2207/10061; G06T 2207/20081; G06T 2207/30148;
  (Continued)

(56) References Cited

U.S. PATENT DOCUMENTS 6,618,850 B2 9/2003 Nishiyama et al.
8,692,214 B2 * 4/2014 Zhao .................. G01N 23/2206
  250/492.1
(Continued)

FOREIGN PATENT DOCUMENTS

CN 101834993 A 9/2010
JP 2001-313322 A 11/2001
(Continued)

OTHER PUBLICATIONS

Korean-language Office Action issued in Korean Application No. 10-2020-0062050 dated Nov. 23, 2021 with English translation (12 pages).
(Continued)

*Primary Examiner* — Emily C Terrell
*Assistant Examiner* — Ahmed A Nasher
(74) *Attorney, Agent, or Firm* — Crowell & Moring LLP

(57) ABSTRACT

A system in which electrical characteristics of an element formed on a sample can be evaluated. The system includes an image acquisition tool and a computer system that includes one or more processors and is configured to be communicable with the image acquisition tool. Electrical characteristic are derived by the image acquisition tool by receiving information regarding two or more characteristics of a specific pattern that is included in a plurality of images acquired from the image acquisition tool under at least two different image acquisition conditions and by referring to, for the information, relation information between information regarding two or more characteristics and electrical characteristics of an element formed on a sample, the characteristics being extracted from at least two pieces of image data acquired from the image acquisition tool under at least two image acquisition conditions.

18 Claims, 24 Drawing Sheets

(52) U.S. Cl.
CPC .......... *G06T 2207/10061* (2013.01); *G06T 2207/20081* (2013.01); *G06T 2207/30148* (2013.01); *H01J 2237/24578* (2013.01)

(58) Field of Classification Search
CPC ........ H01J 37/222; H01J 37/28; H01J 37/268; H01J 37/292; H01J 37/2955; H01J 2237/24578; H01J 2237/24564; H01J 37/244; H01J 2237/2803
See application file for complete search history.

(56) References Cited

U.S. PATENT DOCUMENTS

| | | | |
|---|---|---|---|
| 8,907,279 B2 | 12/2014 | Tsuno et al. | |
| 9,236,220 B2 | 1/2016 | Tsuno et al. | |
| 9,659,744 B2* | 5/2017 | Tsuno | .......... G01N 23/00 |
| 2001/0016938 A1 | 8/2001 | Nishiyama et al. | |
| 2010/0229377 A1 | 9/2010 | Jindo et al. | |
| 2011/0025839 A1* | 2/2011 | Trupke | .......... H01L 31/18 348/87 |
| 2011/0036981 A1* | 2/2011 | Zhao | .......... H01J 37/226 250/306 |
| 2015/0125065 A1 | 5/2015 | Lee et al. | |
| 2016/0148781 A1* | 5/2016 | Tsuno | .......... H01J 37/28 250/307 |
| 2017/0138725 A1 | 5/2017 | Kawada et al. | |
| 2017/0191945 A1* | 7/2017 | Zhang | .......... G06T 5/003 |
| 2019/0079025 A1 | 3/2019 | Hasegawa et al. | |
| 2019/0080445 A1* | 3/2019 | Onishi | .......... H01L 22/12 |

FOREIGN PATENT DOCUMENTS

| | | |
|---|---|---|
| JP | 2003-346695 A | 12/2003 |
| JP | 2005-64128 A | 3/2005 |
| JP | 4015352 B2 | 11/2007 |
| JP | 2014-146615 | 8/2014 |
| JP | 5744629 B2 | 7/2015 |
| JP | 6121651 B2 | 4/2017 |
| JP | 6379018 B2 | 8/2018 |
| KR | 10-2016-0083895 A | 7/2016 |
| TW | 201600828 A | 1/2016 |
| WO | WO 2017/158742 A1 | 9/2017 |

OTHER PUBLICATIONS

Taiwanese-language Office Action issued in Taiwan Application No. 109117633 dated May 26, 2021 (three (3) pages).
Korean-language Notice of Allowance issued in Korean Application No. 10-2020-0062050 dated May 17, 2022 with partial English translation (three (3) pages).
Japanese-language Office Action issued in Japanese Application No. 2019-136567 dated Dec. 13, 2022 (six (6) pages).

* cited by examiner

[FIG. 1]
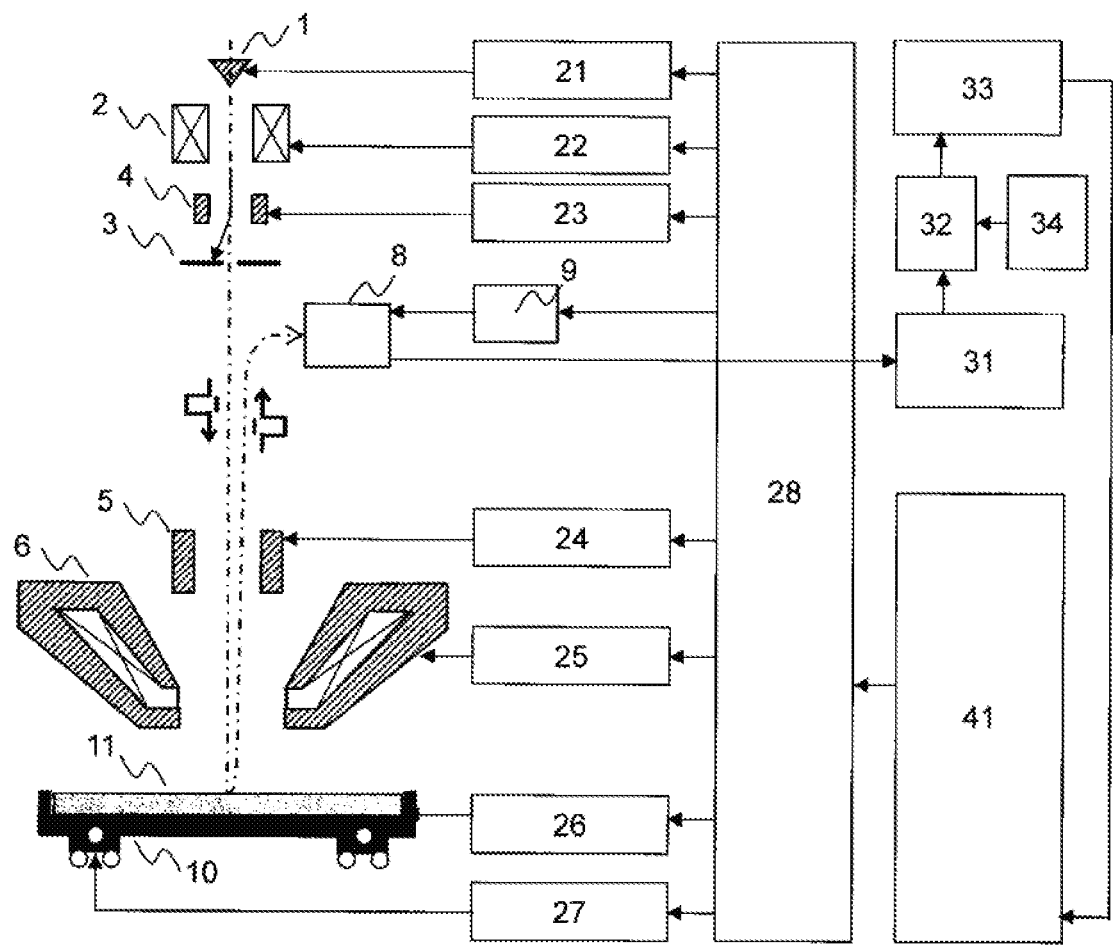

[FIG. 2]
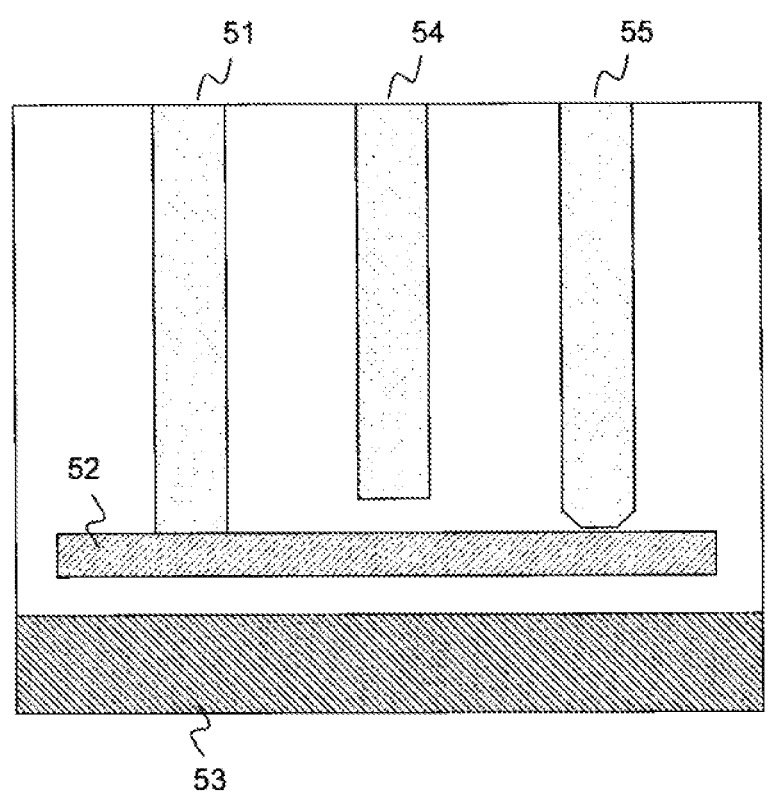

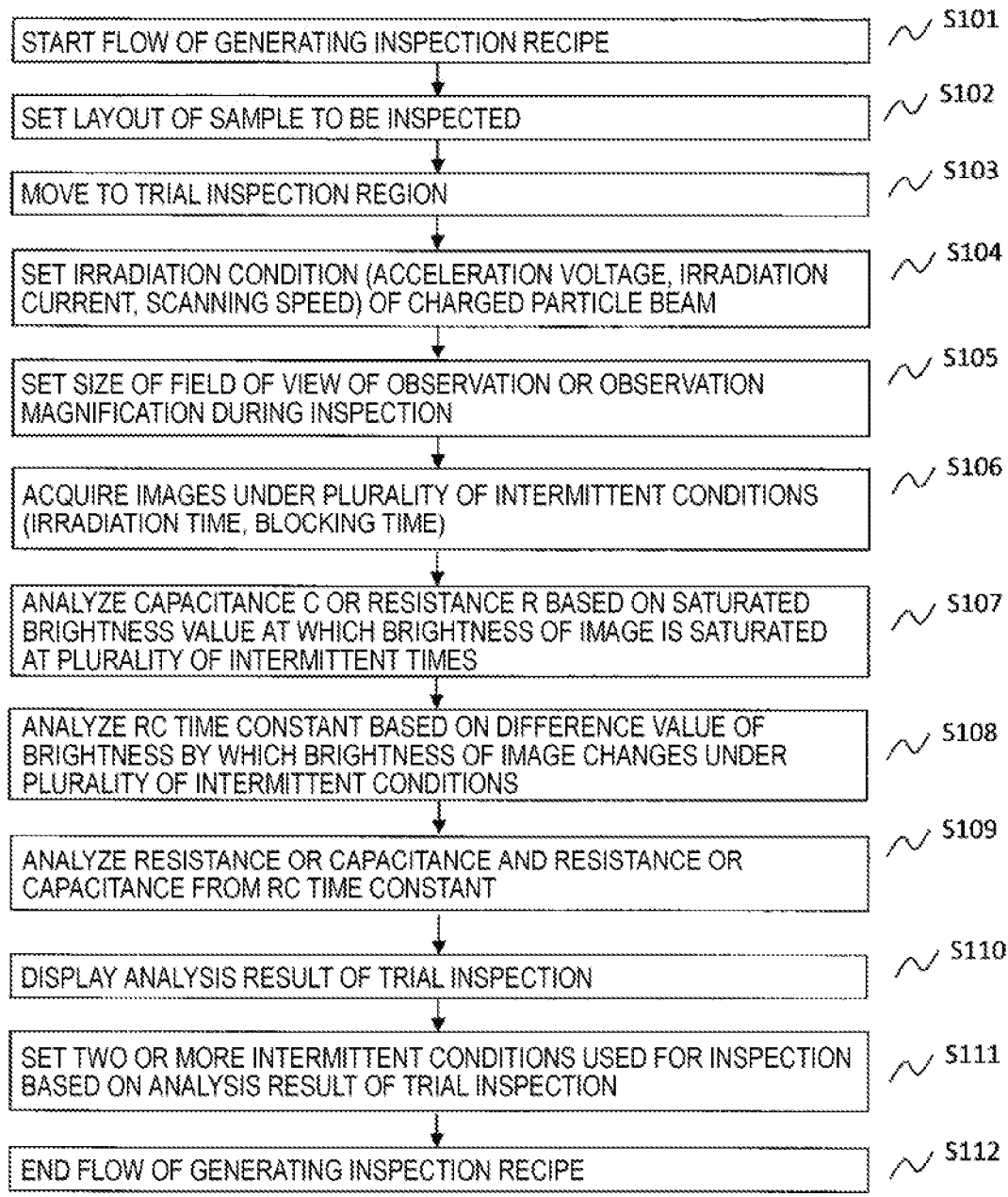

[FIG. 4]
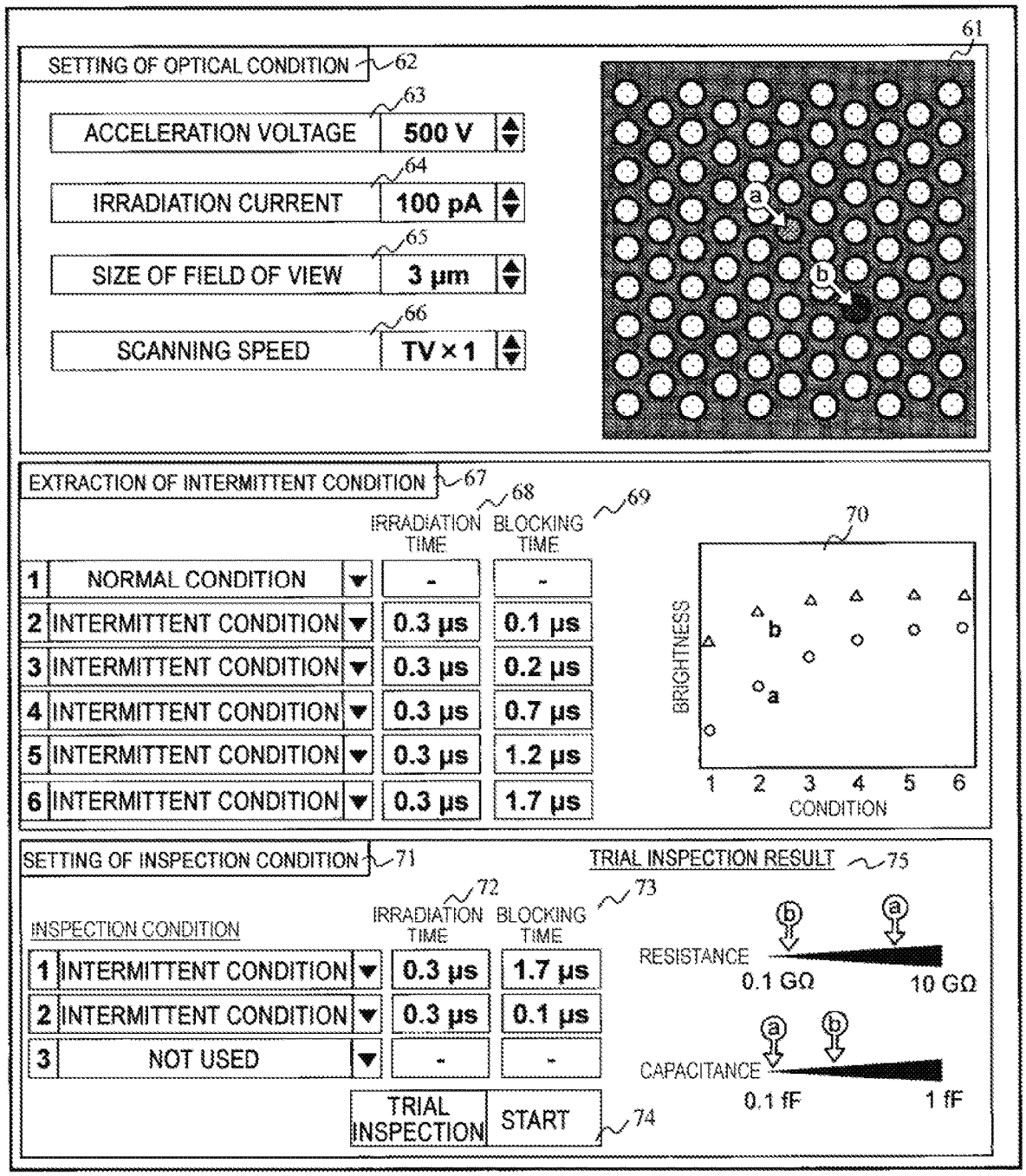

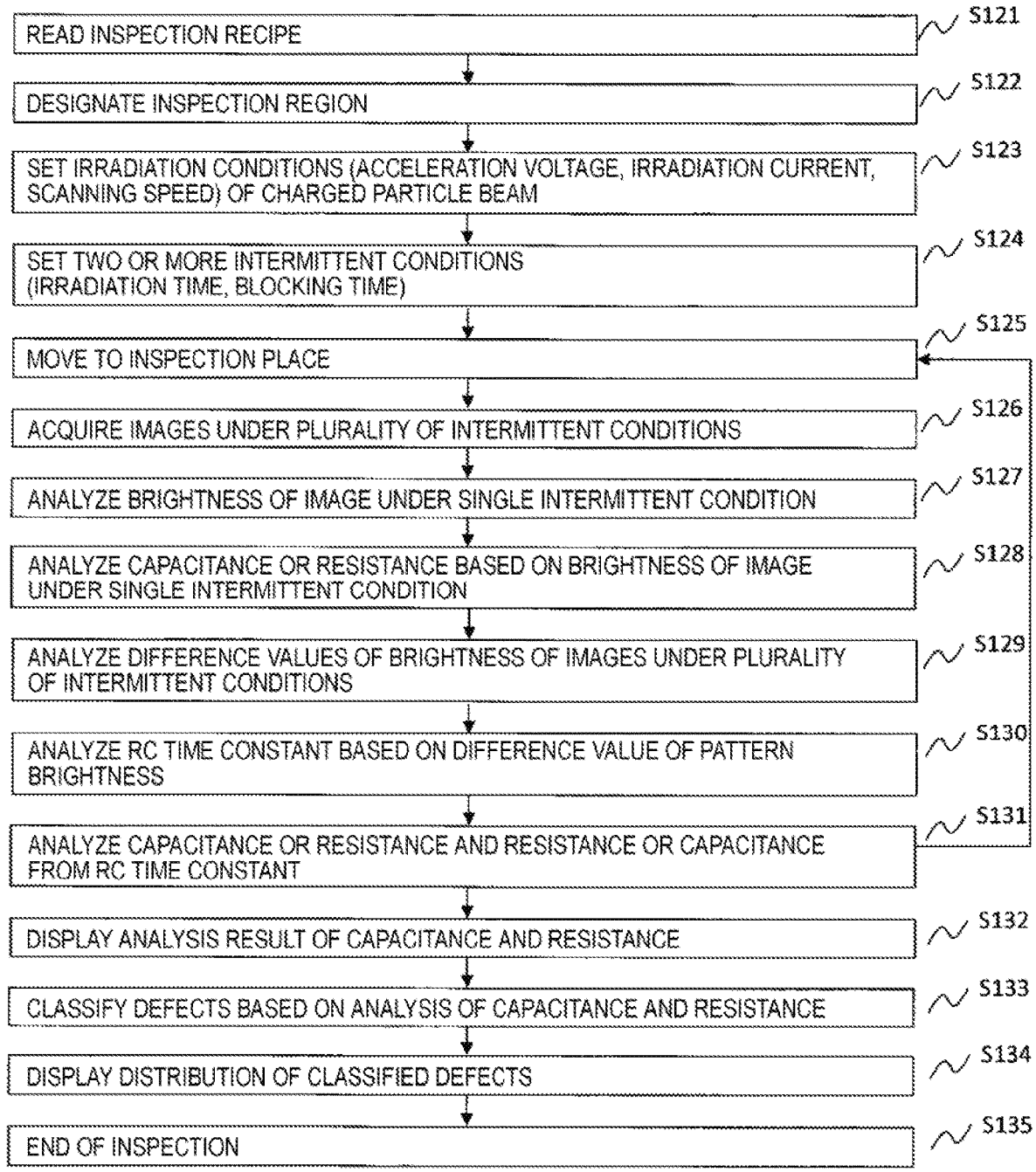

[FIG. 6]
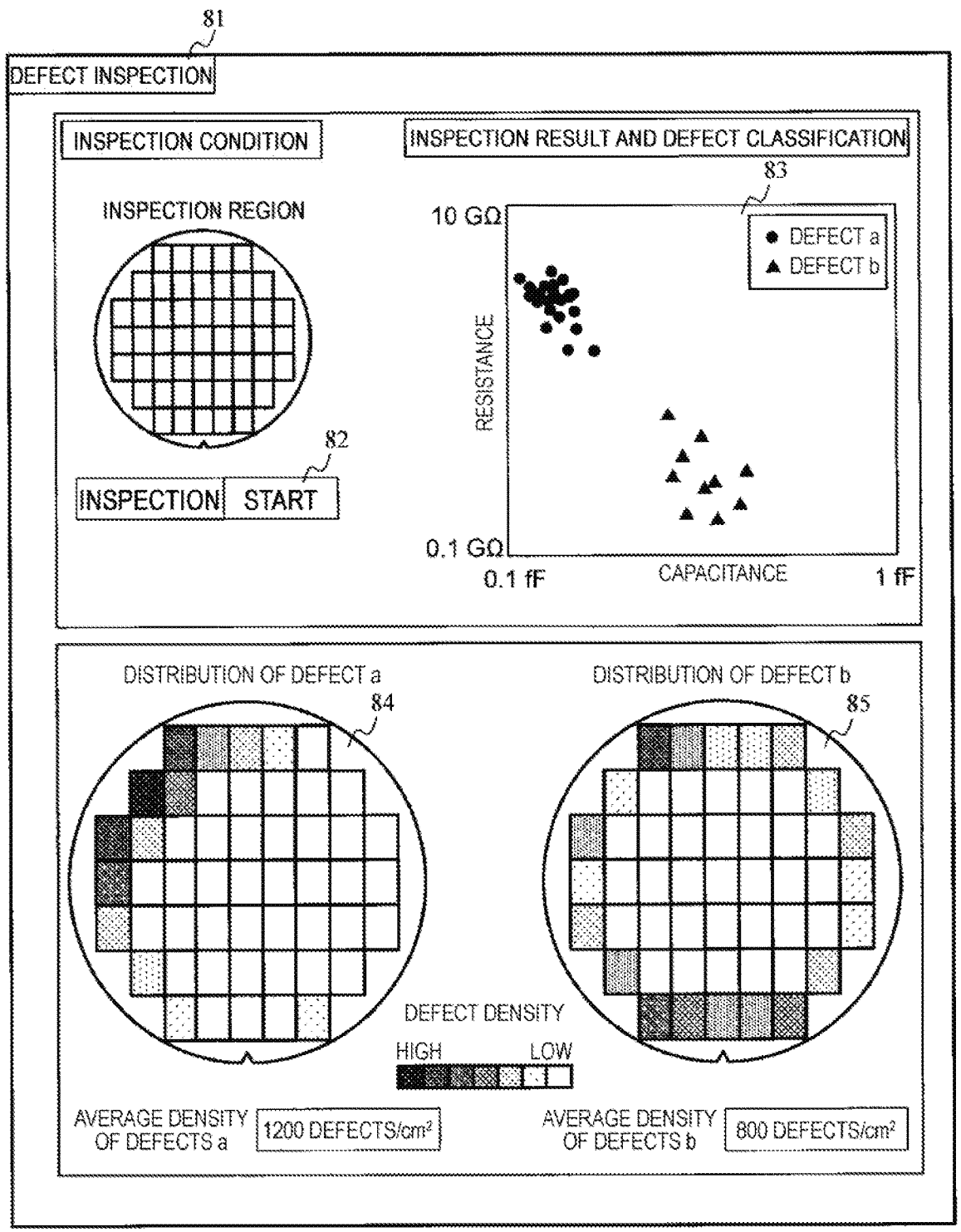

[FIG. 7]
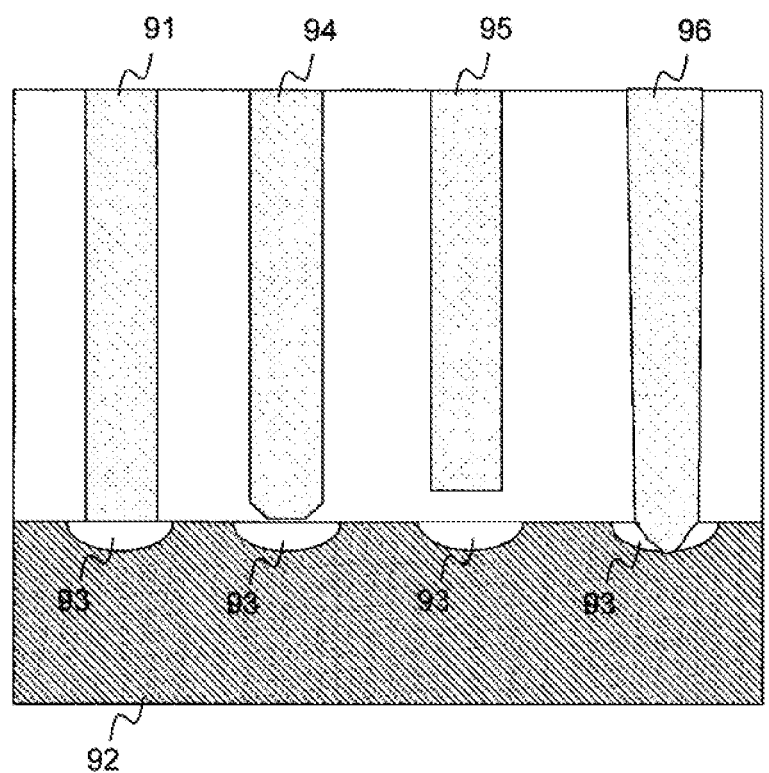

[FIG. 8]

[FIG. 9]
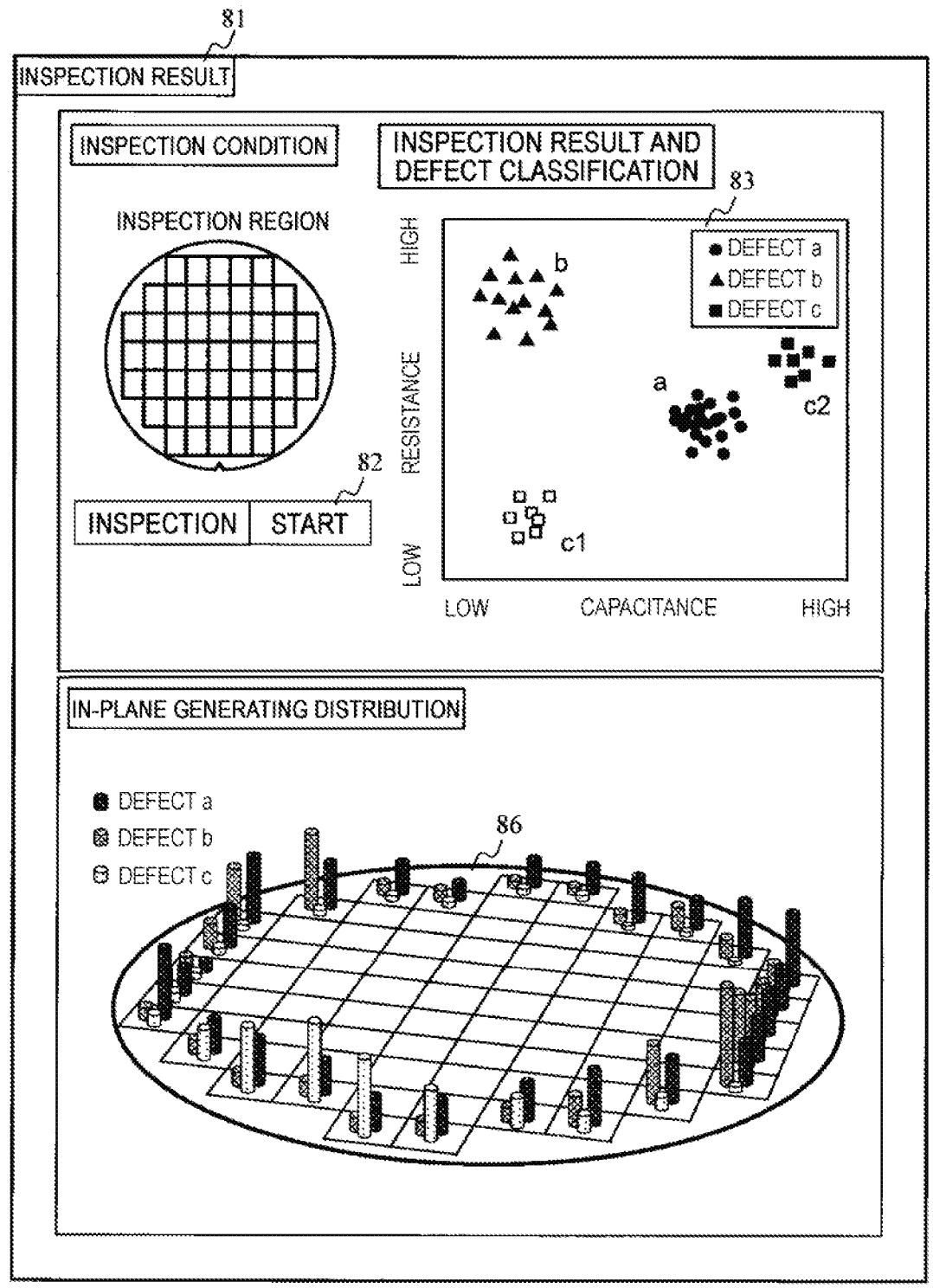

[FIG. 10]
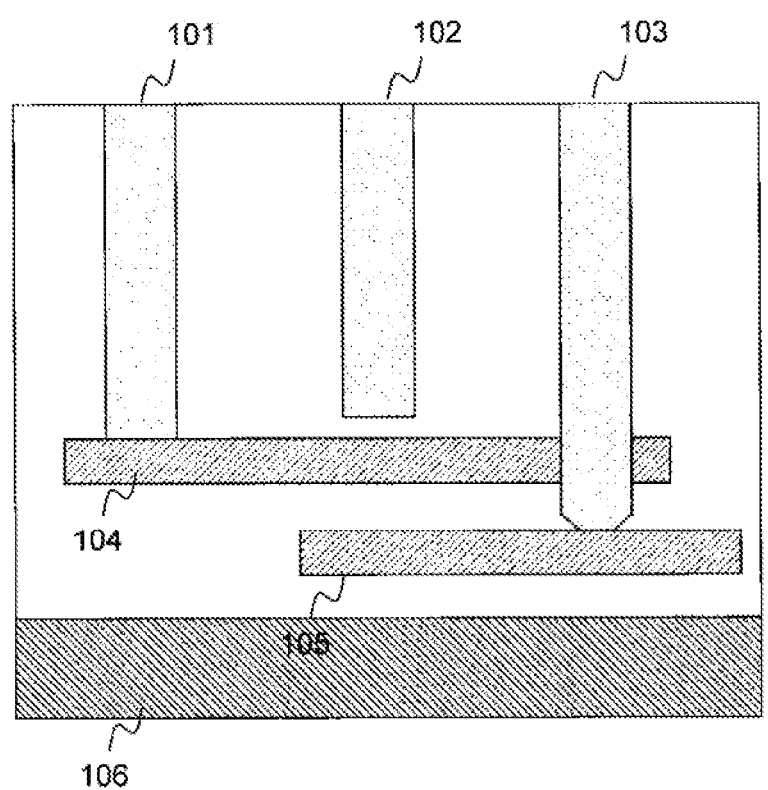

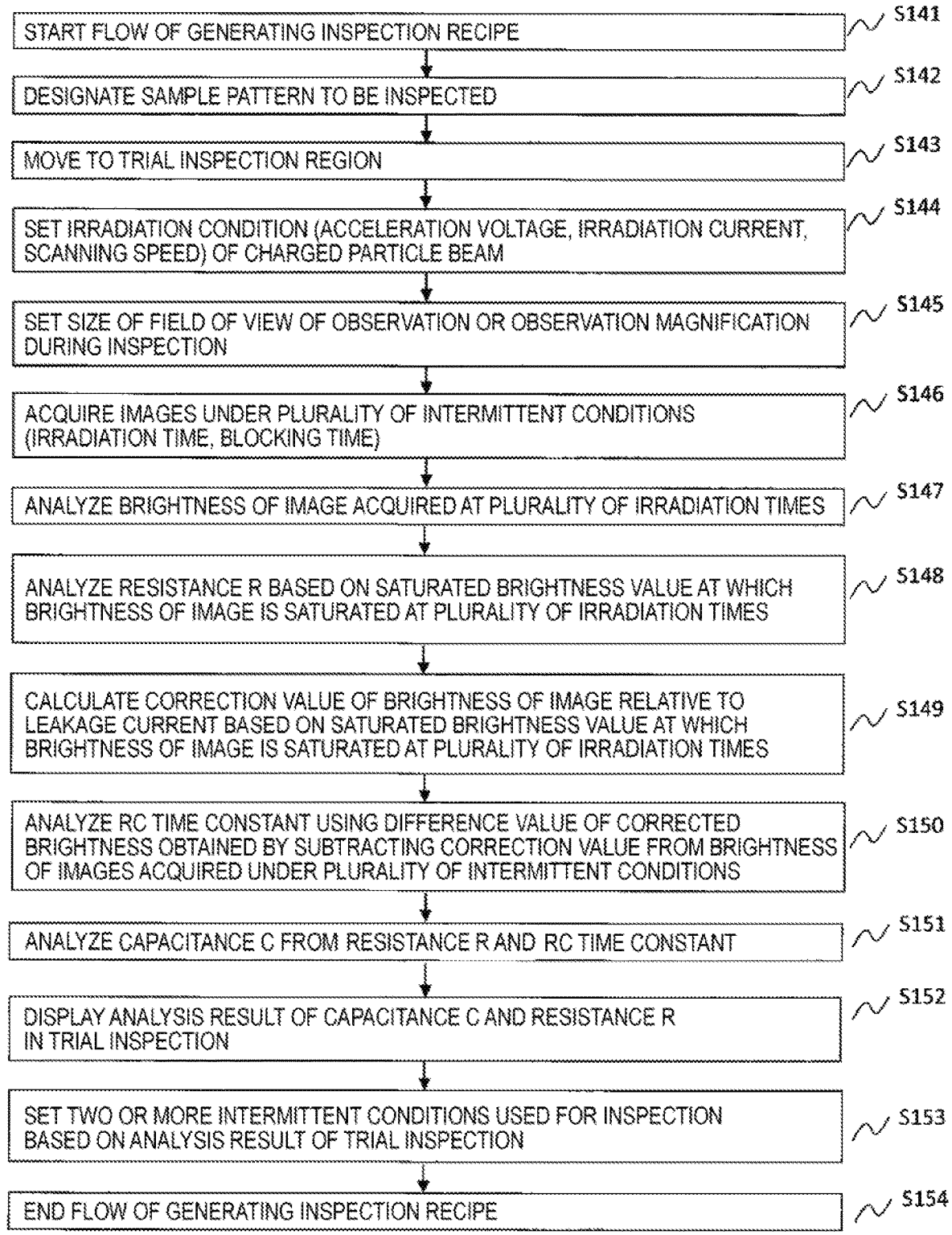

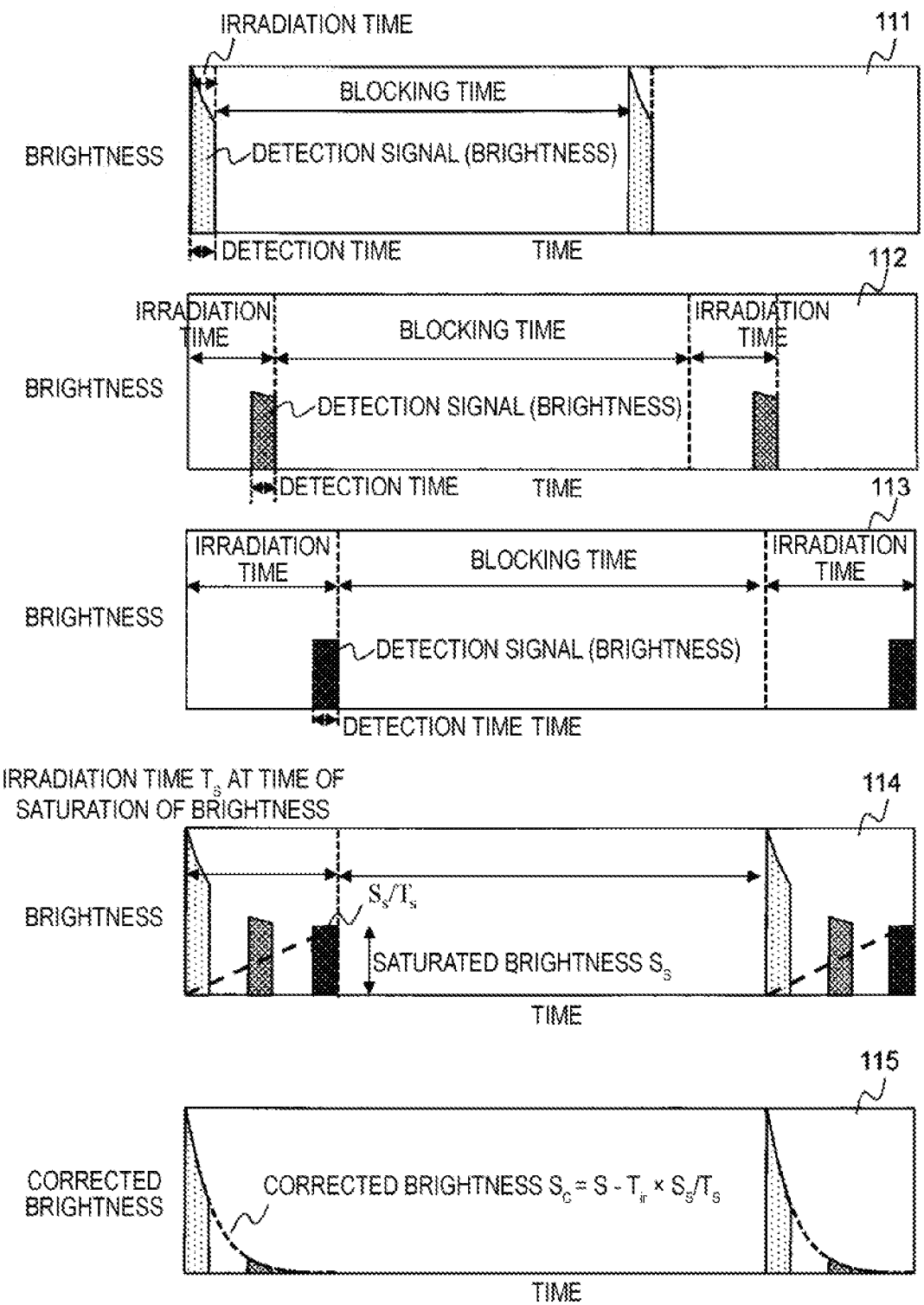
[FIG. 12]

[FIG. 13]

[FIG. 14]
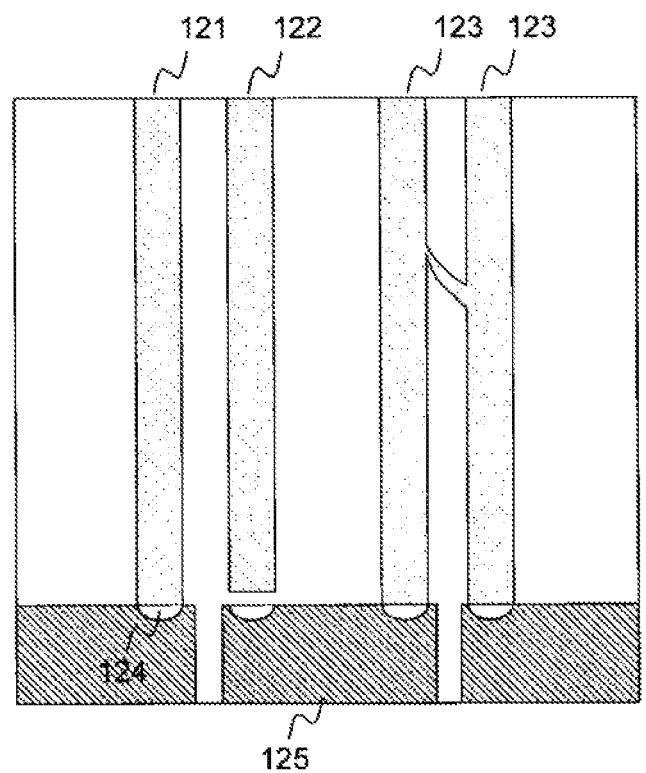

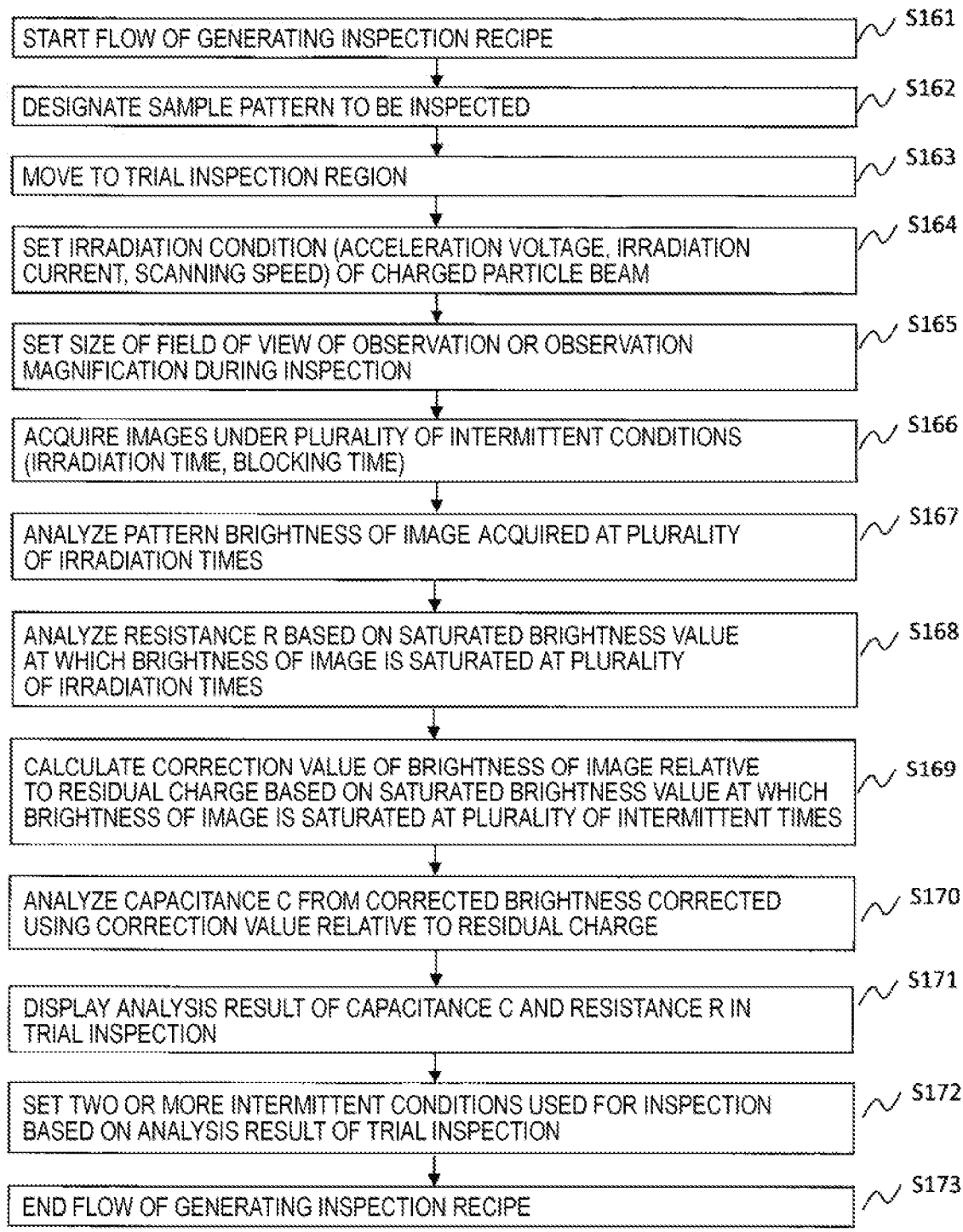

[FIG. 16]
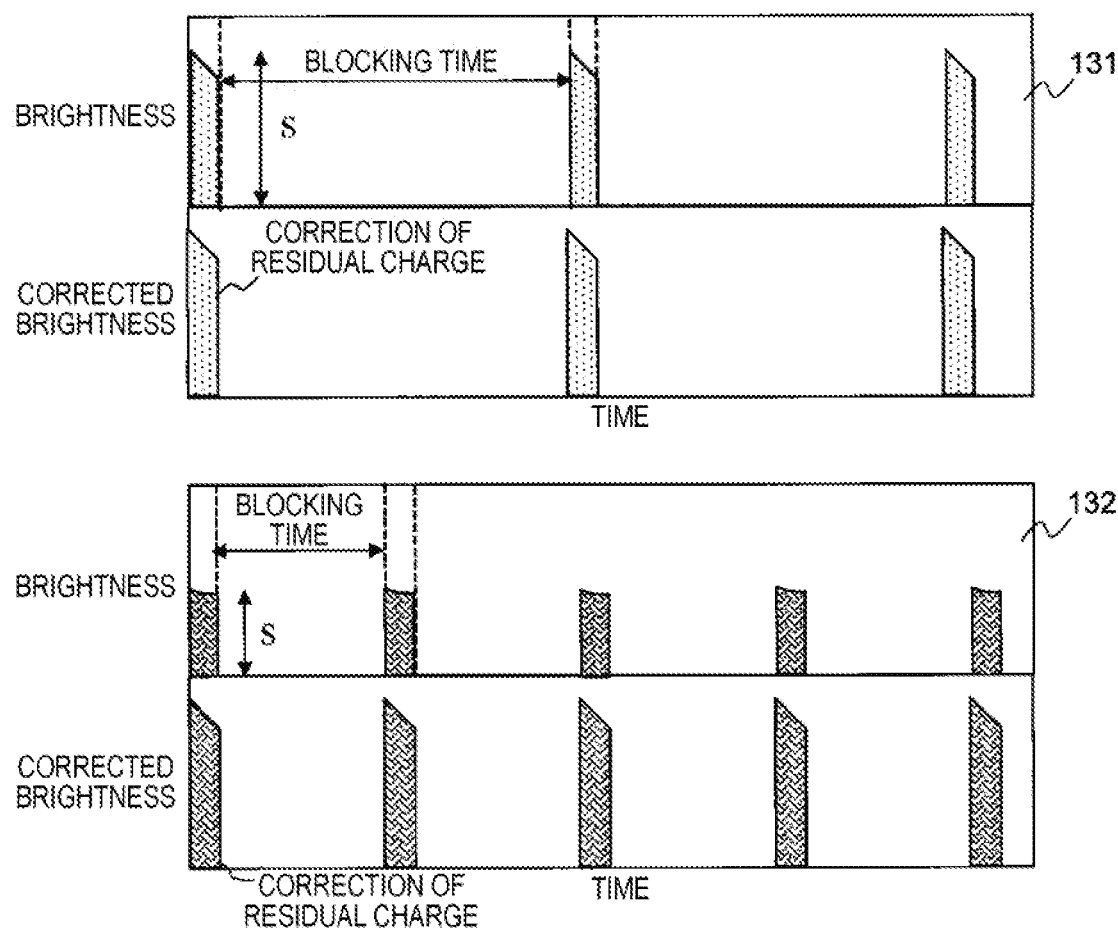

[FIG. 17]
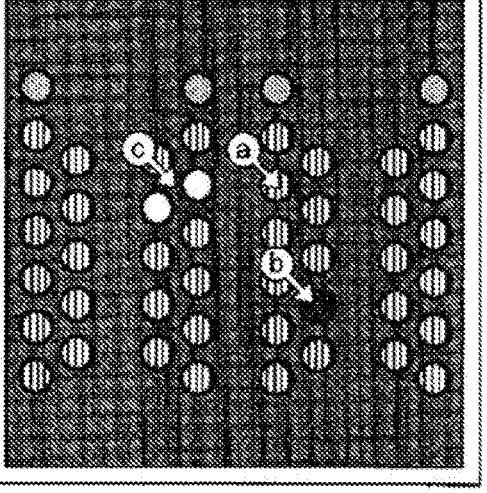

[FIG. 19]
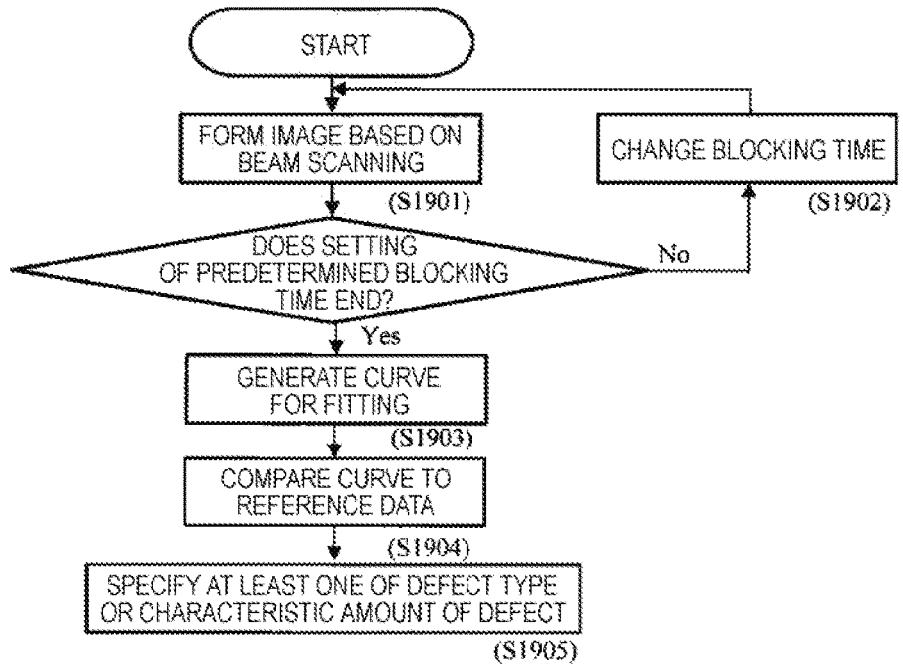
[FIG. 20]
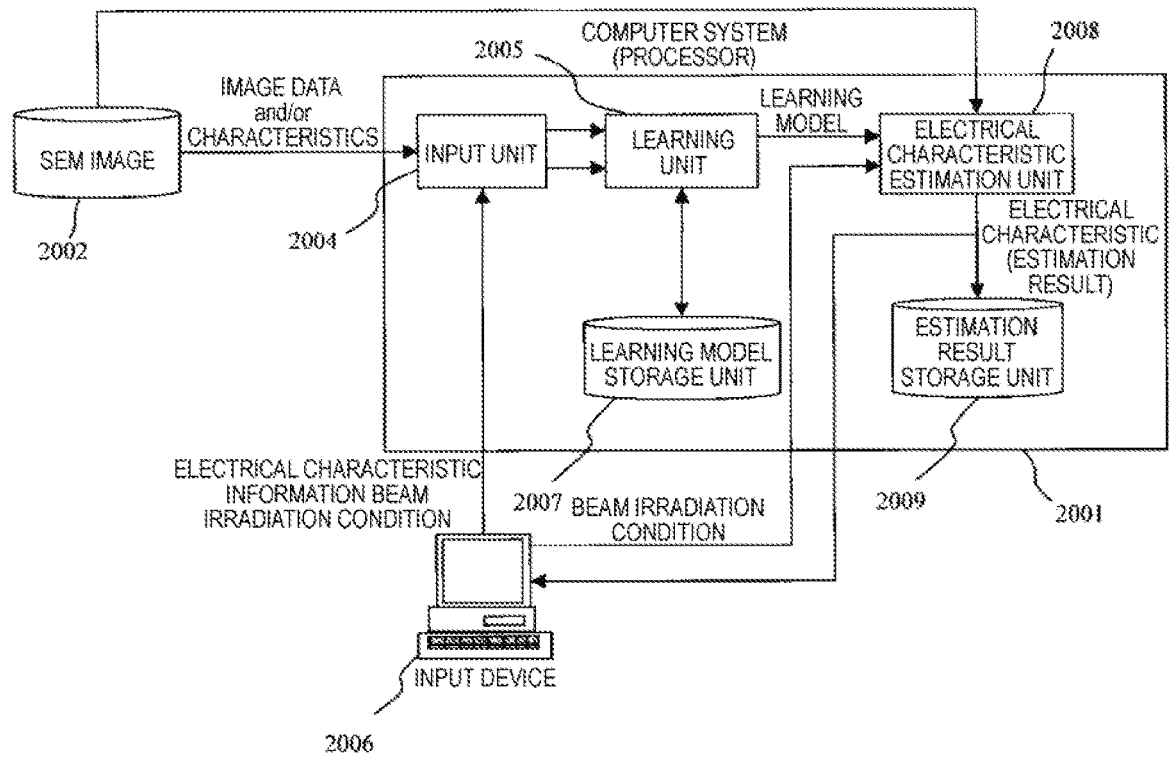

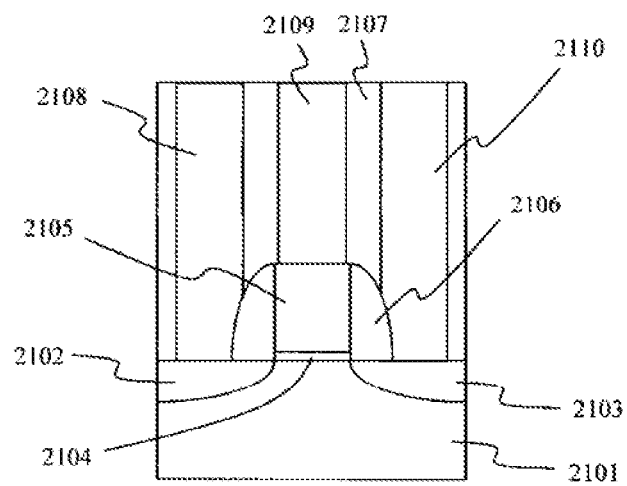
FIG. 21A
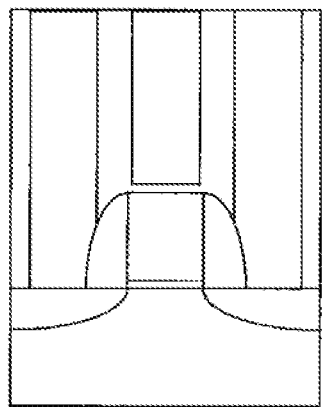 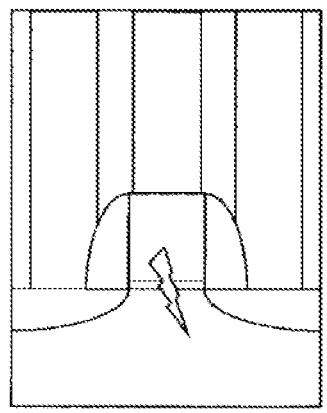 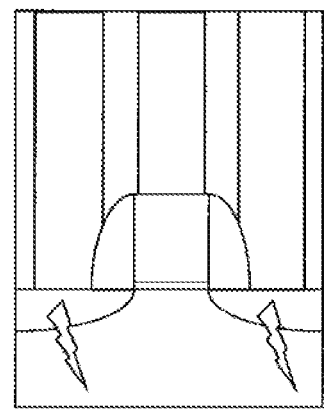
FIG. 21B  FIG. 21C  FIG. 21D

[FIG. 22]
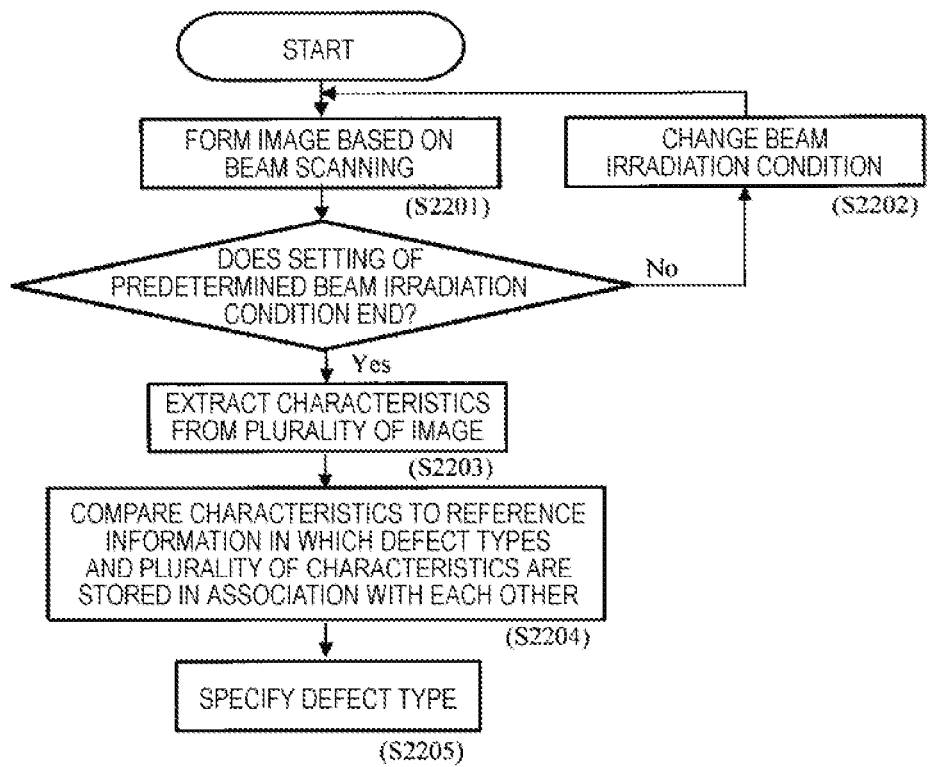

| | BEAM IRRADIATION CONDITION A | BEAM IRRADIATION CONDITION B |
|---|---|---|
| FIG. 23A |  | 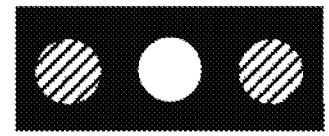 |
| FIG. 23B |  | 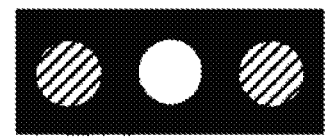 |
| FIG. 23C |  | 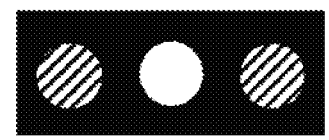 |
| FIG. 24D |  | 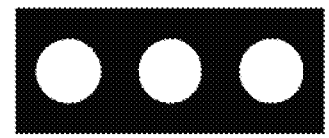 |

[FIG. 25]
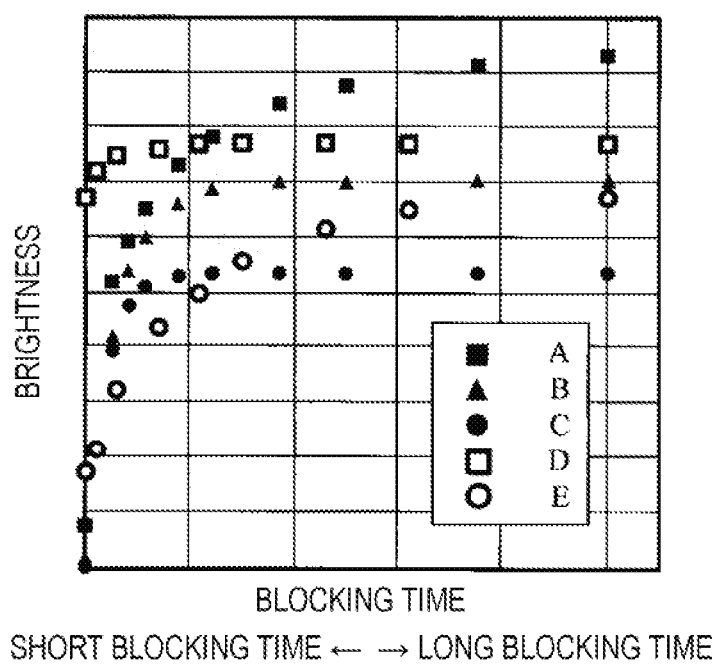

SYSTEM FOR DERIVING ELECTRICAL CHARACTERISTICS AND NON-TRANSITORY COMPUTER-READABLE MEDIUM

TECHNICAL FIELD

The present disclosure relates to a system for deriving electrical characteristics and a non-transitory computer-readable medium, and, in particular, relates to a system for deriving electrical characteristics from a plurality of characteristics obtained under different image acquisition conditions and a non-transitory computer-readable medium.

BACKGROUND ART

As one sample analysis method using an electron microscope, there is known a method including: forming a voltage contrast image based on detection of secondary electrons or the like obtained by irradiating a sample with a pulsed electron beam; and evaluating electrical characteristics of an element formed on the sample based on analysis of the voltage contrast image.

PTL 1 describes a method of analyzing electrical characteristics of a sample using a plurality of SEM images acquired under a plurality of intermittent conditions. PTL 2 describes a method of analyzing a time constant of charge relaxation of a sample using a detection signal of secondary electrons obtained under a plurality of intermittent conditions. PTL 3 describes a method of analyzing a time constant of charge relaxation of a sample from a combined image of images acquired under a plurality of intermittent conditions.

CITATION LIST

Patent Literature

PTL 1: Japanese Patent No. 6379018 (corresponding to U.S. Pat. No. 9,659,744B)
PTL 2: Japanese Patent No. 5744629 (corresponding to U.S. Pat. No. 8,907,279B)
PTL 3: Japanese Patent No. 6121651 (corresponding to U.S. Pat. No. 9,236,220B)

SUMMARY OF INVENTION

Technical Problem

PTLS 1 to 3 describe the methods of evaluating electrical characteristics of an element formed on a sample. However, if more specific electrical characteristics can be evaluated instead of simply determining whether or not to be a defect, advanced process control can be performed in a manufacturing process of a semiconductor device. Hereinafter, disclosed are: a system for deriving electrical characteristics in order to more appropriately evaluate electrical characteristics of an element formed on a sample; and a non-transitory computer-readable medium.

Solution to Problem

In order to achieve the above-described object, disclosed is a system including: an image acquisition tool that acquires an image of a sample; a computer system that includes one or more processors and is configured to be communicable with the image acquisition tool; and a memory that stores relation information between information regarding two or more characteristics and electrical characteristics of an element formed on a sample, the characteristics being extracted from at least two pieces of image data acquired from the image acquisition tool under at least two image acquisition conditions, in which the processor receives information regarding two or more characteristics of a specific pattern that is included in a plurality of images acquired from the image acquisition tool under at least two different image acquisition conditions, receives the relation information from the memory, and derives the electrical characteristics by referring to the relation information for the information regarding the characteristics.

In addition, disclosed is a non-transitory computer-readable medium storing a program which causes a computer to execute the above-described processes.

Further, disclosed is a system for estimating electrical characteristics of an element formed on a sample from image data acquired from an image acquisition tool, the system including: a computer system; and an arithmetic module that is executed by the computer system, in which the computer system includes a learning device that outputs the electrical characteristics of the element as a learning result, the learning device executes learning in advance using teacher data including at least one among at least two pieces of image data acquired from the image acquisition tool under at least two image acquisition conditions, two or more characteristics extracted from the two or more pieces of image data, and information generated from the two or more characteristics, at least two image acquisition conditions of the image acquisition tool, and electrical characteristics, and the arithmetic module outputs the electrical characteristics by inputting, to the learning device, at least one among at least two pieces of image data acquired from the image acquisition tool under at least two image acquisition conditions, two or more characteristics extracted from the two or more pieces of image data, and information generated from the two or more characteristics, and at least two image acquisition conditions of the image acquisition tool.

Advantageous Effects of Invention

With this configuration, electrical characteristics of an element formed on a sample can be appropriately evaluated.

BRIEF DESCRIPTION OF DRAWINGS

FIG. 1 is a diagram showing one example of a scanning electron microscope.
FIG. 2 is a diagram showing a cross-sectional structure of a sample according to Embodiment 1.
FIG. 3 is a flowchart showing one example of an inspection recipe setting process.
FIG. 4 is a diagram showing one example of an operation interface in the inspection recipe setting process.
FIG. 5 is a flowchart showing one example of an inspection process.
FIG. 6 is a diagram showing one example of an operation interface in the inspection process.
FIG. 7 is a diagram showing a cross-sectional structure of a sample according to Embodiment 2.
FIG. 8 is a diagram showing one example of an operation interface in the inspection recipe setting process.
FIG. 9 is a diagram showing one example of an operation interface in the inspection process.
FIG. 10 is a diagram showing a cross-sectional structure of a sample according to Embodiment 3.

FIG. 11 is a flowchart showing one example of the inspection recipe setting process.

FIG. 12 is a diagram showing one example of a method of calculating a correction value of brightness of an image relative to a leakage current.

FIG. 13 is a diagram showing one example of an operation interface in the inspection recipe setting process.

FIG. 14 is a diagram showing a cross-sectional structure of a sample according to Embodiment 4.

FIG. 15 is a flowchart showing one example of the inspection recipe setting process.

FIG. 16 is a diagram showing one example of a method of calculating a correction value of brightness of an image relative to a leakage current and a residual charge.

FIG. 17 is a diagram showing one example of an operation interface in the inspection recipe setting process.

FIG. 19 is a flowchart showing a process of deriving electrical characteristics using a scanning electron microscope.

FIG. 20 is a diagram showing one example of an electrical characteristic estimation system.

FIGS. 21A to 21D are cross-sectional views of a transistor formed on a semiconductor wafer.

FIG. 22 is a flowchart showing a process of deriving electrical characteristics using a scanning electron microscope.

FIGS. 23A to 23D are diagrams illustrating a change of brightness when a beam irradiation condition (image acquisition condition) is changed.

FIG. 25 is a diagram illustrating input data to be input to a learning device that estimates electrical characteristics.

DESCRIPTION OF EMBODIMENTS

Figure 18A:
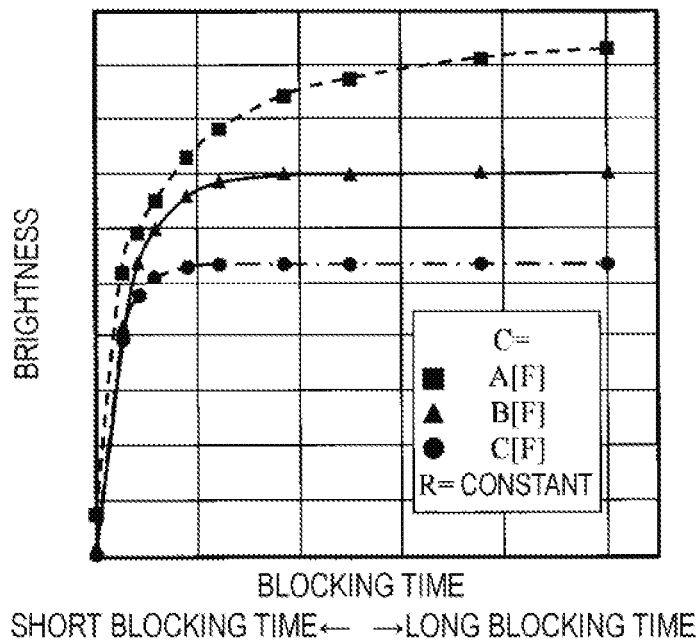
FIGS. 18A and 18B are graphs showing a change of brightness relative to a change of a blocking time of a beam.

A charged particle beam apparatus, for example, a scanning electron microscope (SEM) is an apparatus capable of image formation, measurement, inspection, and the like of a fine pattern in the order of nanometer using a focused electron beam. One observation method using a SEM is a voltage contrast method. The voltage contrast is a contrast on which a difference in surface voltage caused by charging during electron beam irradiation is reflected, and can be used mainly for inspection or the like of an electrical characteristic defect of a semiconductor device. It is presumed that, in order to inspect an electrical characteristic defect, a defect position can be specified using a difference in brightness of a pattern of a SEM image. The brightness is a parameter indicating the degree of lightness of an image or a pixel acquired from a charged particle beam apparatus. In order to improve the detection sensitivity of a defect using a voltage contrast, it is important to control accumulation and relaxation of charge during electron beam irradiation.

In the embodiment described below, an example in which a SEM image is acquired using a pulsed electron beam for the purpose of high-accuracy control of charging will be described. Here, the pulsed electron beam will be referred to as a pulsed electron, and an intermittent condition refers to an irradiation time of the pulsed electron, an irradiation distance of the pulsed electron, a blocking time between irradiation and irradiation, or an inter-irradiation point distance that is a distance interval between irradiation and irradiation.

On the other hand, in a defect inspection of a semiconductor device using a SEM, high-accuracy process control can be realized by classifying or evaluating a defect based on more specific electrical characteristics such as an electrical resistance R or a capacitance C, in addition to specifying a defect position using a difference in brightness. For example, when defects can be classified based on the electrical resistance R and the capacitance C, the defects can be classified into a short-circuit defect having a lower electrical resistance R compared to a normal semiconductor device and a depletion capacitance defect having a higher capacitance C compared to a normal semiconductor device, and the amount of information to be fed back to process control increases. That is, in order to appropriately evaluate an electrical defect, it is desirable to independently analyze electrical parameters such as the electrical resistance R or the capacitance C.

In the embodiment described below, a charged particle beam apparatus that can independently evaluate at least one of a parameter corresponding to the electrical resistance R and a parameter corresponding to the capacitance C will be described. In the embodiment described below, not only an RC time constant that is the product of the electrical resistance R and the capacitance C but also an electrical parameter such as the electrical resistance R and the capacitance C can be independently specified.

In a state where the accumulation of charge is steady, brightness S of a voltage contrast image is inversely proportional to the electrical resistance R and obeys Ohm's law as shown in Expression 1.

$$S \propto \frac{V_s}{R} \qquad \text{[Expression 1]}$$

Here, Vs represents a surface voltage when charge is saturated and represents a charged state obtained under an intermittent condition having a long irradiation time. When charge is saturated, the surface voltage is substantially constant. Therefore, as the electrical resistance R decreases, the brightness S of an image increases, and as the electrical resistance R increases, the brightness S of an image decreases.

On the other hand, when charge is in a transient state, the brightness S of an image is proportional to the capacitance C and is represented by Expression 2.

$$S \propto \left\{ \frac{Q(Tir)}{C} + \frac{Q(Tir)}{C} e^{-Ti/RC} \right\}^{-1} \qquad \text{[Expression 2]}$$

Here, Q represents a charge absorbed by a sample during electron beam irradiation, Tir represents an irradiation time, Ti represents a blocking time between irradiation and irradiation, and RC represents a time constant. Under an intermittent condition where the blocking time Ti between irradiation and irradiation is sufficiently long relative to RC, Expression 2 can be approximated to Expression 3.

$$S \propto \frac{C}{Q(Tir)} \qquad \text{[Expression 3]}$$

The absorbed charge is constant irrespective of electrical characteristics. Therefore, as the capacitance C increases, the brightness S of an image increases, and as the capacitance C decreases, the brightness S of an image decreases.

In addition, a difference between brightness ΔS that is extracted from an image acquired by beam scanning under a condition (first intermittent condition) where the blocking time between irradiation and irradiation is Ti1 and brightness that is extracted from an image acquired by beam scanning under a condition (second intermittent condition) where the blocking time between irradiation and irradiation is Ti2 can be represented by Expression 4.

$$\Delta S \propto \frac{C}{Q(Tir)} \left( e^{-Ti1/RC} - e^{-Ti2/RC} \right) \qquad \text{[Expression 4]}$$

As shown in Expression 4, the difference ΔS in image brightness represents a change amount of brightness depending on the RC time constant. When the RC time constant has the same time order as that of the blocking time Ti1 or Ti2, the difference ΔS in brightness increases. In addition, the RC time constant, the electrical resistance R, and the capacitance C have a relationship of Expression 5.

$$RC = R \times C \qquad \text{[Expression 5]}$$

The present disclosure has been made based on a new finding relating to a relationship between charging caused by electron beam irradiation and electrical characteristics of an element formed on a sample, and mainly relates to a method, a system, and a non-transitory computer-readable medium described below. The system includes a computer system that executes arithmetic processing based on an image signal or a characteristic amount output from the charged particle beam apparatus.

In addition, the charged particle beam apparatus including the computer system will also be described.

For example, in the following embodiment, a charged particle beam apparatus will be described, the apparatus including: a charged particle source; means for pulsing a charged particle beam emitted from the charged particle source; a charged particle beam optical system that convergently irradiates a sample with the pulsed charged particle beam while scanning with the beam; a secondary charged particle detection system that detects secondary charged particles emitted from the sample; means for forming an image based on an intensity of a detection signal of the secondary charged particles; an intermittent irradiation system that controls an intermittent condition of the pulsed charged particle beam such as an irradiation time or a blocking time between irradiation and irradiation; and an image processing system including a processor that independently specifies a plurality of electrical characteristics from brightness of the image obtained under a plurality of intermittent conditions, in which one of R and C is analyzed based on an image brightness under a first intermittent condition, an RC time constant is analyzed based on a difference in image brightness between the first intermittent condition and a second intermittent condition, and another one of R or C is analyzed based on one of R or C and the RC time constant such that the electrical characteristics can be independently specified.

With the above-described configuration, the electrical resistance and the capacitance based on application of an appropriate arithmetic expression can be obtained. In addition, in the embodiment described below, a defect position can be specified using a difference in brightness, and electrical characteristics including the electrical resistance R and the capacitance C can be independently specified. As a result, defects having different electrical characteristics such as a short-circuit defect or a defect with abnormal depletion capacitance can be classified.

Hereinafter, a charged particle beam apparatus that independently specifies the electrical resistance R and the capacitance C as electrical characteristics of a sample based on brightness of an image obtained by intermittent irradiation of a charged particle beam will be described with reference to the drawings.

In the following description, a scanning electron microscope that irradiates a sample with an electron beam and detects secondary electrons to form an image will be described as one example of a charged particle beam apparatus that irradiates a sample with a charged particle beam and detects secondary charged particles to form an image, but the present disclosure is not limited thereto. For example, an ion beam apparatus that irradiates a sample with an ion beam and detects secondary ions or secondary electrons to form an image can also be used as the image acquisition tool.

Embodiment 1

In the present embodiment, regarding a defect inspection apparatus that classifies and inspects defects of a sample having different electrical characteristics using an image of a scanning electron microscope, a scanning electron microscope having a function of independently analyzing the electrical resistance R and the capacitance C of defects from brightness of images acquired under a plurality of intermittent conditions will be described.

FIG. 1 shows one example of the scanning electron microscope according to the present embodiment. The scanning electron microscope is configured with an intermittent irradiation system, an electron optical system, a secondary electron detection system, a stage mechanism system, an image processing system, a control system, and an operation system. The intermittent irradiation system is configured with an electron beam source 1 and a pulsed electron generator 4. In the present invention, the pulsed electron generator 4 is separately provided. However, an electron beam source that can irradiate a pulsed electron can also be used.

The electron optical system is configured with a condenser lens 2, a diaphragm 3, a deflector 5, and an objective lens 6. The deflector 5 is provided to one-dimensionally or two-dimensionally scan the sample with the electron beam and is a target to be controlled as described below.

The secondary electron detection system is configured with a detector 8 and an output adjustment circuit 9. The stage mechanism system is configured with a sample stage 10 and a sample 11. The control system is configured with an acceleration voltage controller 21, an irradiation current controller 22, a pulse irradiation controller 23, a deflection controller 24, a focusing controller 25, a sample electric field controller 26, a stage position controller 27, and a control transmitter 28. The control transmitter 28 controls writing of a control value to each of the controllers based on input information input from an operation interface 41.

Here, the pulse irradiation controller 23 controls an irradiation time that is a time for which an electron beam is continuously irradiated, an irradiation distance that is a distance by which an electron beam is continuously irradiated, a blocking time that is a time between irradiation and irradiation of an electron beam, or an inter-irradiation point distance that is a distance interval between irradiation and irradiation of an electron beam. In the present embodiment, the pulse irradiation controller 23 controls the irradiation time that is a time for which an electron beam is continuously irradiated and the blocking time that is a time between irradiation and irradiation of an electron beam.

The pulse irradiation controller 23 controls a scanning deflector that scans the sample with a beam and a blanking deflector that blocks irradiation of a sample with a beam such that a pulsed beam is generated. During beam irradiation by the scanning deflector, a blanking electrode generates a pulsed beam by intermittently blocking a beam according to a set irradiation condition.

The image processing system is configured with a detection signal processing unit 31, a detection signal analysis unit 32, an image or electrical characteristic display unit 33, and a database 34. The detection signal processing unit 31 or the detection signal analysis unit 32 of the image processing system includes one or more processors and executes an arithmetic operation of brightness of a designated inspection pattern, an arithmetic operation of a difference in brightness between a plurality of inspection patterns, or an arithmetic operation of analyzing or classifying electrical characteristics based on brightness or a difference in brightness. The database 34 of the image processing system is a storage medium that stores calibration data when the arithmetic operation or the like of analyzing electrical characteristics is executed such that the calibration data is read and used during the arithmetic operation.

The operation system is configured with the operation interface 41. FIG. 2 is a cross-sectional view of a sample used in the present embodiment. A plug 51 is in contact with a wiring 52 that is electrically floating from a silicon substrate 53. A plug 54 is a defective plug that is not in contact with the wiring 52 at all. A plug 55 is a defective plug that has an electrical resistance and is coupled to the wiring 52. In the present embodiment, the above-described two types of defects are classified and inspected.

The above-described control, image processing, and the like are executed by one or more computer systems including one or more processors. The one or more computer systems are configured to execute an arithmetic module stored in a predetermined storage medium in advance, and automatically or semi-automatically execute a process as described below. Further, the one or more computer systems are configured to be communicable with the image acquisition tool.

FIG. 3 is a flowchart showing an inspection recipe setting process of independently analyzing the electrical resistance R and the capacitance C of a defect in the present embodiment.

First, a sample moves to an observation place (S101). Next, a layout of a sample to be inspected is designated (S102). Here, the layout is a layout of a repeated pattern region of a semiconductor wafer. Next, the sample moves to a trial inspection region used for generating the recipe using layout information (S103). Next, an optical condition is set (S104).

Here, the optical condition includes an acceleration voltage of an electron beam, an irradiation current of an electron beam, and a scanning speed. Next, a size of a field of view of observation or an observation magnification is set (S105). Next, a plurality of intermittent conditions are set and an image is acquired (S106). The plurality of intermittent conditions set in S106 are different from each other in at least one condition among the irradiation time, the irradiation distance, the blocking time, or the inter-irradiation point distance. Further, the plurality of intermittent conditions set in S106 have at least two different blocking times.

Next, the capacitance C or the electrical resistance R is analyzed based on a saturated brightness value at which the brightness of the image is saturated at a plurality of intermittent times (S107). In S107 of the present embodiment, first, the brightness values of a plurality of images having different blocking times as intermittent conditions are compared to each other, a first threshold and a second threshold are set for a change amount of the brightness of the image depending on a change of the blocking time, and the brightness of the image at a blocking time at which the change amount of the brightness is the first threshold or less is set as the saturated brightness value. In addition, in S107 of the present embodiment, the capacitance is analyzed (calculated) based on Expression 3.

Next, the RC time constant is analyzed using a difference value of brightness of a plurality of images acquired under a plurality of intermittent conditions (S108). In S108 of the present embodiment, the RC time constant is analyzed based on Expression 4. Here, it is desirable that $\Delta S$ represents a difference between the saturated brightness value and a brightness (for example, corresponding to a peak position by differential processing) at which the change amount of brightness is maximum and the blocking times Ti1 and Ti2 represent a blocking time having the saturated brightness value and a blocking time at which the change amount of brightness is maximum, respectively.

Next, the electrical resistance R or the capacitance C is analyzed from the analyzed capacitance and RC time constant or analyzed resistance and RC time constant (S109). Here, a parameter that is not calculated in S107 is calculated.

In S109 of the present embodiment, the electrical resistance R is analyzed based on Expression 5. The intermittent conditions and the results of brightness of the image or the electrical resistance R and the capacitance C obtained in the trial inspection are displayed (S110).

Next, two or more intermittent conditions used for the inspection are set (S111). In the present embodiment, the apparatus automatically extracts a blocking time as a first intermittent condition at which the change amount of the brightness is the first threshold or less and a blocking time as a second intermittent condition at which the change amount of the brightness is the second threshold or less from the intermittent conditions used in the trial inspection, respectively. Next, the inspection recipe generation process ends (S112).

As described above, by using a computer system and an arithmetic module that are configured to calculate one of a first characteristic (for example, R) or a second characteristic (for example, C) of an element formed on a sample by inputting another one of the first characteristic or the second characteristic, a plurality of irradiation conditions of a beam (for example, a plurality of blocking times), and comparison information ($\Delta S$) of characteristic amounts during beam irradiation under a plurality of irradiation conditions into relation information (for example, Expression 3) of the first characteristic, the second characteristic, the plurality of irradiation conditions of a beam (for example, the intermittent time), and the comparison information ($\Delta S$), the two characteristics can be appropriately evaluated based on selection of an appropriate arithmetic expression corresponding to the element.

Whether a defect is a capacitance defect or an electrical resistance defect can also be determined from a characteristic of a change of brightness when a plurality of beam blocking conditions are set. Here, the capacitance defect refers to a defect in which the electrical resistances are almost the same but the capacitances are different from each other among a plurality of patterns in a region of interest (ROI). On the other hand, the electrical resistance defect refers to a defect in which the capacitances are almost the same but the electrical resistances are different from each other among a plurality of patterns in the ROI.

Figure 18B:
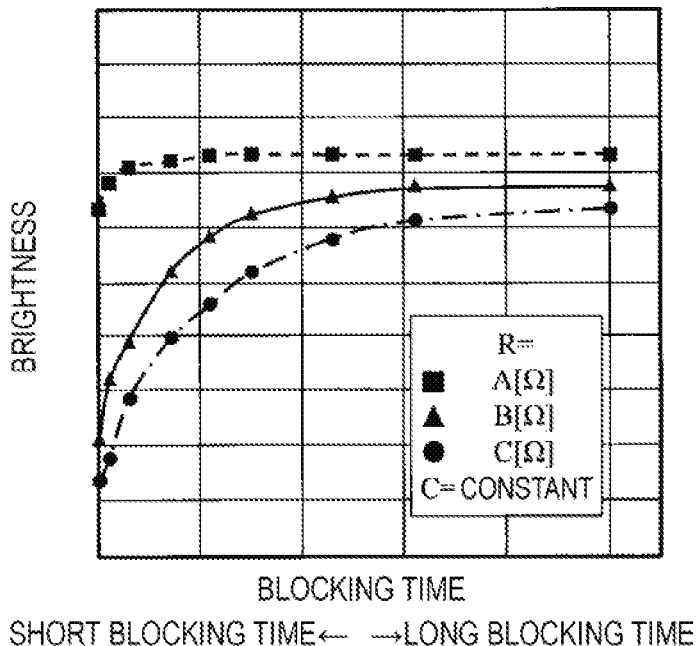

FIG. 18 is a graph showing a change of brightness relative to a change of the blocking time (time for which a pulsed beam is not irradiated), in which (a) of FIG. 18 shows a change of brightness relative to a change of the blocking time of the capacitance defect and (b) of FIG. 18 shows a change of brightness relative to a change of the blocking time of the electrical resistance defect. As shown in FIG. 18, the electrical resistance defect and the capacitance defect are different from each other in the characteristic of the change of brightness when the blocking time is changed. Accordingly, whether a defect is a capacitance defect or an electrical resistance defect may be determined based on the difference in the characteristic.

In addition, in the case of the capacitance defect, as the blocking time increases, the difference of brightness for each capacitance tends to get larger. By using this characteristic, a defect type may be determined from, for example, a difference between brightness in case that the blocking time is long and a previously registered average brightness value (an average brightness value of different capacitance defects) in case that the blocking time is long. In this case, for example, it is thought that when the difference exceeds a predetermined threshold, the defect is determined to be a capacitance defect, and when the difference is the predetermined threshold or less, the defect is determined to be an electrical resistance defect.

In addition, in the case of the electrical resistance defect, as the blocking time decreases, the difference of brightness for each electrical resistance tends to become clear. By using this characteristic, a defect type may be determined from, for example, a difference between brightness in case that the blocking time is short and a previously registered average brightness value (an average brightness value of different electrical resistance defects) in case that the blocking time is short. In this case, for example, it is thought that when the difference exceeds a predetermined threshold, the defect is determined to be an electrical resistance defect, and when the difference is the predetermined threshold or less, the defect is determined to be a capacitance defect.

In addition, by fitting the obtained curve to a curve representing a relationship between a change of the blocking time and a change of brightness that is stored in advance for each defect type, a defect type may be classified according to the degree of coincidence of the curves. Further, it is also thought that a plurality of curves corresponding to a plurality of capacitances and a plurality of curves corresponding to a plurality of electrical resistances are prepared (stored) in advance to estimate a capacitance or an electrical resistance according to the degree of coincidence thereof.

As described above, when the defect is determined to be the capacitance defect, C may be obtained using Expression 3 in S107, and when the defect is determined to be the electrical resistance defect as described above, R may be obtained using Expression 1.

FIG. 19 is a flowchart showing a process for determining the type of electrical characteristics or the characteristic amount. As in Step 106 of FIG. 3, an image is formed at each of a plurality of blocking times (Steps 1901 and 1902), a set number of images (blocking conditions) are acquired, a curve (function) representing a change of the blocking time and a change of the characteristic amount (brightness) extracted from the images is generated (Step 1903), the curve is compared to reference data in which the defect type or the characteristic amount (capacitance and electrical resistance) of a defect are stored in association with each other (Step 1904), and at least one of the defect type and the characteristic amount of a defect is specified (Step 1905). The curve is information generated from two or more characteristics that are extracted from two or more pieces of image data acquired under a plurality of image acquisition conditions having different irradiation conditions. In the following embodiment, this curve will also be referred to as an S-curve.

The type or a characteristic of a defect can be derived by referencing this information to relation information between information, that is generated from two or more characteristics extracted from at least two pieces of image data acquired under two or more image acquisition conditions, and at least one of the type of a defect of an element formed on an sample and the characteristics of the defect (electrical characteristic).

In the computer system that can execute the process as shown in FIG. 19, not only whether or not a defect is present but also the type and characteristic amount of the defect can be specified.

FIG. 4 shows an operation interface in the inspection recipe setting process used in the present embodiment. The operation interface displays a SEM image and includes an inspection pattern setting unit 61 for designating an inspection pattern of which electrical characteristics are analyzed from a trial inspection image. In the present embodiment, a pattern a and a pattern b are selected. In addition, the operation interface includes an optical condition/scanning condition/field of view setting unit 62, an acceleration voltage setting unit 63, an irradiation current setting unit 64, a field-of-view size setting unit 65, and a scanning speed setting unit 66. In the present embodiment, the acceleration voltage is set to 500 V, the irradiation current is set to 100 pA, the size of the field of view is set to 3 µm, and the scanning speed is set to a TV rate.

In addition, an intermittent condition extraction unit 67, which sets a plurality of intermittent conditions and analyzes the intermittent condition dependence of the brightness of a pattern selected by the inspection pattern setting unit 61, includes: an irradiation setting unit 68 that sets an irradiation time or an irradiation distance; an inter-irradiation point setting unit 69 that sets a blocking time between irradiation points or a distance between irradiation points; and a brightness analysis result display unit 70 that displays the intermittent condition dependence of the brightness of the pattern. In the present embodiment, the irradiation setting unit 68 is configured to set the irradiation time, and the inter-irradiation point setting unit 69 is configured to set the blocking time.

In addition, in the present embodiment, six conditions can be set as the plurality of intermittent conditions, and the plurality of intermittent conditions include a normal condition that is normal scanning. As the plurality of intermittent conditions, the irradiation time is set to 0.3 µs, and the blocking times are set to 0.1, 0.2, 0.7, 1.2, and 1.7 µs, respectively.

In addition, an inspection condition setting unit 71, which sets a plurality of intermittent conditions used for the inspection and displays the analysis results of the electrical resistance R and the capacitance C in the trial inspection, includes: an irradiation setting unit 72 that sets an irradiation time or an irradiation distance used for the inspection; an inter-irradiation point setting unit 73 that sets a blocking time between irradiation points or a distance between irradiation points used for the inspection; a trial inspection execution unit 74 that executes the trial inspection; and a trial inspection result display unit 75 in which the electrical resistance R and the capacitance C in the trial inspection are displayed.

In the present embodiment, as the intermittent conditions used for the inspection, a first intermittent condition in which an irradiation time is 0.3 µs and a blocking time is 1.7 µs and a second intermittent condition in which an irradiation time is 0.3 µs and a blocking time is 0.1 µs are extracted, and the capacitance C is analyzed based on Expression 3 using the brightness of the image acquired under the first intermittent condition. In addition, in the present embodiment, the capacitance C is analyzed using the relationship between the brightness and the capacitance C as the calibration data that is stored in the database 34 shown in FIG. 1 in advance.

In addition, in the present embodiment, the RC time constant is analyzed based on Expression 4 using a difference in brightness between the image acquired under the first intermittent condition and the image under the second intermittent condition.

FIG. 5 is a flowchart showing the inspection process of independently analyzing the electrical resistance R and the capacitance C of a defect to classify the defect. First, the inspection recipe generated in the flowchart of FIG. 3 is read (S121). Next, a region to be inspected is designated (S122). Next, the optical condition read from the inspection recipe is set from the control transmitter 28 (S123). Next, a plurality of intermittent conditions are set (S124). Next, the sample moves to an inspection place (S125). Next, images are acquired under a plurality of intermittent conditions (S126).

In the present embodiment, images are acquired under the first intermittent condition and the second intermittent condition set in the inspection recipe. Next, the brightness of an image is analyzed under a single intermittent condition (S127). In the present embodiment, the brightness of the image is analyzed under the first intermittent condition. Next, the capacitance C or the electrical resistance R is analyzed based on the image brightness acquired under the single intermittent condition (S128). In the present embodiment, the capacitance C is analyzed based on Expression 3 using the brightness of the image acquired under the first intermittent condition.

Next, a difference in brightness between images acquired under a plurality of intermittent conditions is analyzed (S129). In the present embodiment, a difference in brightness between the images acquired under the first intermittent condition and the second intermittent condition is analyzed. Next, the RC time constant is analyzed based on the difference value of the pattern brightness (S130). In the present embodiment, the RC time constant is analyzed based on Expression 4.

Next, another electrical characteristic value (the value of an electrical characteristic different from the previously obtained electrical characteristic) is analyzed using the capacitance C or the electrical resistance R obtained in S128 and the RC time constant obtained in S130 (S131). In the present embodiment, the capacitance C is obtained in advance in S128. Therefore, the electrical resistance R is analyzed using Expression 5 from the capacitance C and the RC time constant obtained in S130. In the designated inspection region, Steps S125 to S131 are repeated. Next, the results of the electrical resistance and the capacitance are displayed (S132). Next, the type of a defect is classified from the results of the electrical resistance and the capacitance (S133). Next, a generating state in a wafer surface is displayed as the classified result (S134). In the present embodiment, an average defect density or the like is also displayed as the inspection result. Next, the inspection process ends (S135).

FIG. 6 shows an operation interface in a defect inspection process used in the present embodiment. The operation interface includes an inspection region setting unit 81 that sets the inspection region, and includes an inspection execution unit 82 that reads the inspection recipe generated in the flowchart of FIG. 3 and executes the inspection. In addition, the operation interface includes a defect classification setting unit 83 that displays the inspection results of the electrical resistance R and the capacitance C and classifies defects based on the inspection results. In the present embodiment, defects are classified into a defect a group having a high electrical resistance R and a low capacitance C and a defect b group having a low electrical resistance R and a high capacitance C. The defect a group corresponds to a defective plug of the plug 54 of FIG. 2, and the defect b group corresponds to a defective plug of the plug 55 of FIG. 2.

In addition, the operation interface includes: a defect a group generating distribution display unit 84 that displays an in-wafer distribution of the classified defect a group or an average defect density thereof; and a defect b group generating distribution display unit 85 that displays an in-wafer distribution of the classified defect b group or an average defect density thereof.

In the above-described embodiment, the electrical resistance R and the capacitance C can be independently analyzed under a plurality of intermittent conditions. With this analysis, defects can be classified based on the electrical resistance R and the capacitance C, and the generating status of the classified defects can be provided.

Embodiment 2

In the present embodiment, regarding a defect inspection apparatus that classifies and inspects defects of a sample having different electrical characteristics using an image of a scanning electron microscope, a scanning electron microscope having a function of independently analyzing the electrical resistance R and the capacitance C of defects from brightness of images acquired under a plurality of intermittent conditions will be described.

In the present embodiment, the scanning electron microscope shown in FIG. 1 is used. FIG. 7 is a cross-sectional view of a sample used in the present embodiment. A plug 91 is a normal plug that is in contact with an impurity diffusion layer 93 formed on a part of a silicon substrate 92. The silicon substrate 92 and the impurity diffusion layer 93 form a PN junction and have diode characteristics. A plug 94 is a defective plug that is in contact with the impurity diffusion layer with high resistance. A plug 95 is a defective plug that is not in contact with the impurity diffusion layer at all. A plug 96 is a defective plug that is in contact with the destructed impurity diffusion layer.

In the present embodiment, three types of defective plugs are classified and inspected. In the present embodiment, the flowchart of the inspection recipe setting process shown in FIG. 3 is used. In the present embodiment, in S107 shown in FIG. 3, the electrical resistance R is analyzed based on Expression 1. In addition, in the present embodiment, in S109 shown in FIG. 3, the capacitance C is analyzed based on Expression 5.

Figure 8:
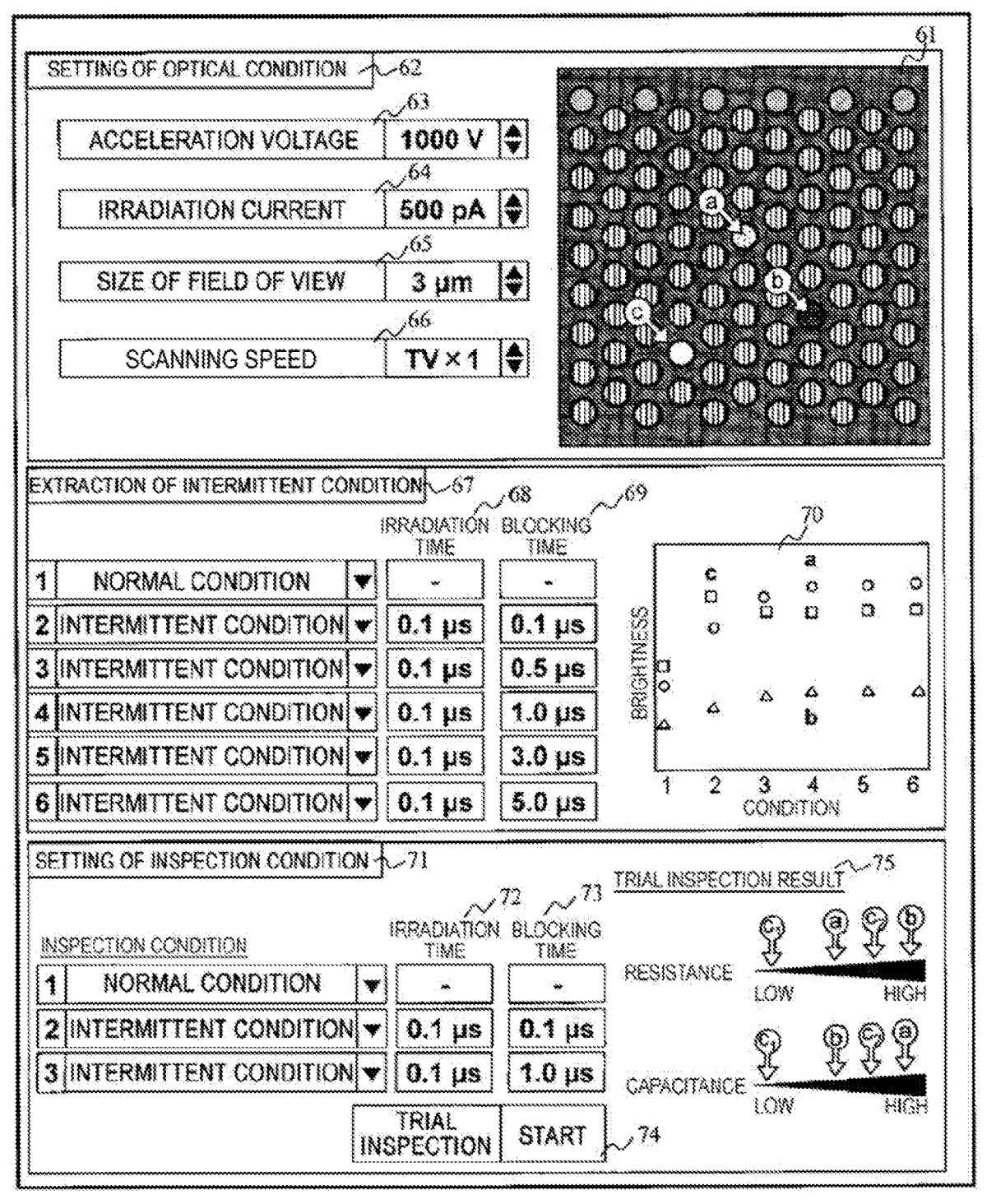

FIG. 8 shows an operation interface in the inspection recipe setting process used in the present embodiment. The operation interface includes an inspection pattern setting unit 61 for displaying the SEM image shown in FIG. 4 and designating an inspection pattern of which electrical characteristics are analyzed from a trial inspection image. In the present embodiment, a pattern a, a pattern b, and a pattern c are selected as targets to be inspected. In addition, the operation interface includes the optical condition/scanning condition/field of view setting unit 62 shown in FIG. 4, and the acceleration voltage setting unit 63, the irradiation current setting unit 64, the field-of-view size setting unit 65, and the scanning speed setting unit 66 shown in FIG. 4. In the present embodiment, the acceleration voltage is set to 1000 V, the irradiation current is set to 500 pA, the size of the field of view is set to 3 μm, and the scanning speed is set to a TV rate.

In addition, as shown in FIG. 4, the operation interface includes the intermittent condition extraction unit 67 that sets a plurality of intermittent conditions and analyzes the intermittent condition dependence of the brightness of the pattern selected by the inspection pattern setting unit 61. In the present embodiment, the irradiation setting unit 68 is configured to set the irradiation time, and the inter-irradiation point setting unit 69 is configured to set the blocking time. In addition, in the present embodiment, six conditions can be set as the plurality of intermittent conditions, and the plurality of intermittent conditions include a normal condition that is normal scanning. As the plurality of intermittent conditions, the irradiation time is set to 0.1 μs, and the blocking times are set to 0.1, 0.5, 1.0, 3.0, and 5.0 μs, respectively.

In addition, as shown in FIG. 4, the operation interface includes the inspection condition setting unit 71 that sets a plurality of intermittent conditions used for the inspection and displays the analysis results of the electrical resistance R and the capacitance C in the trial inspection.

In the present embodiment, as the intermittent conditions used for the inspection, a first intermittent condition as a normal condition, a second intermittent condition in which an irradiation time is 0.1 μs and a blocking time is 0.1 μs, and a third intermittent condition in which an irradiation time is 0.1 μs and a blocking time is 1.0 μs are extracted, and the electrical resistance R is analyzed based on Expression 1 using the brightness of the image acquired under the first intermittent condition.

In addition, in the present embodiment, only the relative magnitude of electrical resistance R is analyzed, and the absolute value thereof is not calibrated.

In addition, in the present embodiment, a first RC time constant is analyzed based on Expression 4 using a difference in brightness between the image acquired under the first intermittent condition and the image acquired under the second intermittent condition, and a second RC time constant is analyzed based on Expression 4 using a difference in brightness between the image acquired under the second intermittent condition and the image under the third intermittent condition.

When the same defective plug has a plurality of RC time constants, a first capacitance C and a second capacitance C can be analyzed from the electrical resistance R, the first RC time constant, and the second RC time constant. In the present embodiment, only for the pattern c, the first electrical resistance R and the capacitance C, and the second electrical resistance R and the capacitance C are output as the inspection result. In the present embodiment, the flowchart of the inspection process of classifying defects shown in FIG. 5 is used.

FIG. 9 shows an operation interface in a defect inspection process used in the present embodiment. The operation interface includes the inspection region setting unit 81 that sets the inspection region, and includes the inspection execution unit 82 that reads the inspection recipe generated in the flowchart of FIG. 3 and executes the inspection. In addition, the operation interface includes the defect classification setting unit 83 that displays the inspection results of the electrical resistance R and the capacitance C and classifies defects based on the inspection results.

In the present embodiment, defects are classified into a defect a group having an intermediate electrical resistance R and an intermediate capacitance C, a defect b group having a high electrical resistance R and a low capacitance C, and a defect c group having the first electrical resistance R, the second electrical resistance R, and the capacitance C. The defect a group corresponds to the defective plug of the plug 94 of FIG. 7, the defect b group corresponds to the defective plug of the plug 95 of FIG. 7, and the defect c group corresponds to the defective plug of the plug 96 of FIG. 7. In addition, the operation interface includes a defect group generating distribution display unit 86 that displays an in-wafer distribution of the classified defect groups.

In the above-described embodiment, the electrical resistance R and the capacitance C can be independently analyzed under a plurality of intermittent conditions. With this analysis, defects can be classified based on the electrical resistance R and the capacitance C, and the generating status of the classified defects can be provided.

Embodiment 3

In the present embodiment, regarding a defect inspection apparatus that classifies and inspects defects of a sample having different electrical characteristics using an image of a scanning electron microscope, a scanning electron microscope having a function of correcting the brightness according to electrical characteristics and independently analyzing the electrical resistance R and the capacitance C of defects with high accuracy from brightness values of images acquired under a plurality of intermittent conditions will be described.

In the present embodiment, the scanning electron microscope shown in FIG. 1 is used.

FIG. 10 is a cross-sectional view of a sample used in the present embodiment. A plug 101 is in contact with a wiring 104 that is electrically floating from a silicon substrate 106. A plug 102 is a defective plug that is not in contact with the wiring 104. A plug 103 is a defective plug that penetrates the wiring 104 and is in contact with a wiring 105 being positioned below the wiring 104 and being electrically floating. In the present embodiment, the normal plug and the two types of defective plugs are classified and inspected.

FIG. 11 is a flowchart showing an inspection recipe setting process of correcting the brightness according to electrical characteristics and independently analyzing the electrical resistance R and the capacitance C of defects with high accuracy in the present embodiment.

First, a sample moves to an observation place (S141). Next, a layout of a sample to be inspected is designated (S142). Here, the layout is a layout of a repeated pattern region of a semiconductor wafer. Next, the sample moves to a trial inspection region used for generating the recipe using layout information (S143). Next, an optical condition is set (S144). Here, the optical condition includes an acceleration voltage of an electron beam, an irradiation current of an electron beam, and a scanning speed. Next, a size of a field of view of observation or an observation magnification is set (S145). Next, a plurality of intermittent conditions are set and an image is acquired (S146). The plurality of intermittent conditions set in S146 are different from each other in at least one condition among the irradiation time, the irradiation distance, the blocking time, or the inter-irradiation point distance. Further, the plurality of intermittent conditions set in S146 have at least two different irradiation times.

Next, brightness of images acquired under a plurality of intermittent conditions is analyzed (S147). Next, the electrical resistance R is analyzed based on a saturated brightness value at which the brightness of the image is saturated at a plurality of irradiation times (S148). In S148 of the present embodiment, first, the brightness values of a plurality of images having different irradiation times are compared to each other, a threshold is set for a change amount of the brightness of the image depending on a change of the irradiation time, and the brightness of the image at an irradiation time at which the change amount of the brightness is the threshold or less is set as the saturated brightness value. In addition, In S107 of the present embodiment, the electrical resistance is analyzed based on Expression 1. Next, the correction value of the brightness of the image relative to a leakage current is calculated based on the saturated brightness value at a plurality of irradiation times (S149). Next, the RC time constant is analyzed using a difference value of corrected brightness obtained by subtracting the correction value from the brightness of the images acquired under a plurality of intermittent conditions (S150).

Next, the capacitance C is analyzed from the electrical resistance R and the RC time constant (S151). Next, the results of the intermittent conditions and the brightness of the image or the electrical resistance R and the capacitance C obtained in the trial inspection are displayed (S152). Next, two or more intermittent conditions used for the inspection are set (S153). In the present embodiment, the user manually sets the intermittent conditions. However, the apparatus may automatically determine and set the intermittent conditions from the intermittent conditions used. Next, the inspection recipe generation process ends (S154).

FIG. 12 shows a method of calculating the correction value of the brightness of the image relative to a leakage current in S149 in the present embodiment. It can be seen from a time change 111 of brightness obtained at a first irradiation time, a time change 112 of brightness obtained at a second irradiation time, and a time change 113 of brightness obtained at a third irradiation time that, as the irradiation time increases, the brightness decreases due to charging of electron beam irradiation. In addition, a decrease in brightness is saturated at the third irradiation time. On the brightness at the third irradiation time, a leakage current flowing due to an internal electric field of the sample during charging is reflected. As shown in a time change 114 of brightness obtained at the first to third irradiation times, in the present embodiment, this change of brightness caused by a leakage current is linearly corrected. A corrected brightness Sc is represented by Expression 6.

$$Sc = S - Tir \times \frac{S_S}{T_S} (0 \le Tir \le T_S)$$ [Expression 6]

Here, S represents brightness, Tir represents an irradiation time, $S_s$ represents brightness during saturation obtained at the third irradiation time, and $T_s$ represents an irradiation time when a decrease in brightness is saturated, and corresponds to the third irradiation time. Here, $S_s$ corresponds to S obtained in Expression 1. In a time change 115 of corrected brightness corrected using Expression 6, the dependence of a leakage current is corrected. In addition, in S149, the correction value of brightness for obtaining ΔS in Expression 4 is calculated. As shown in FIG. 12, the irradiation time $T_s$ during the saturation of brightness is obtained in advance from a curve obtained by changing the irradiation time and the detection timing (time). As a result, the correction using Expression 6 can be performed.

Figure 13:
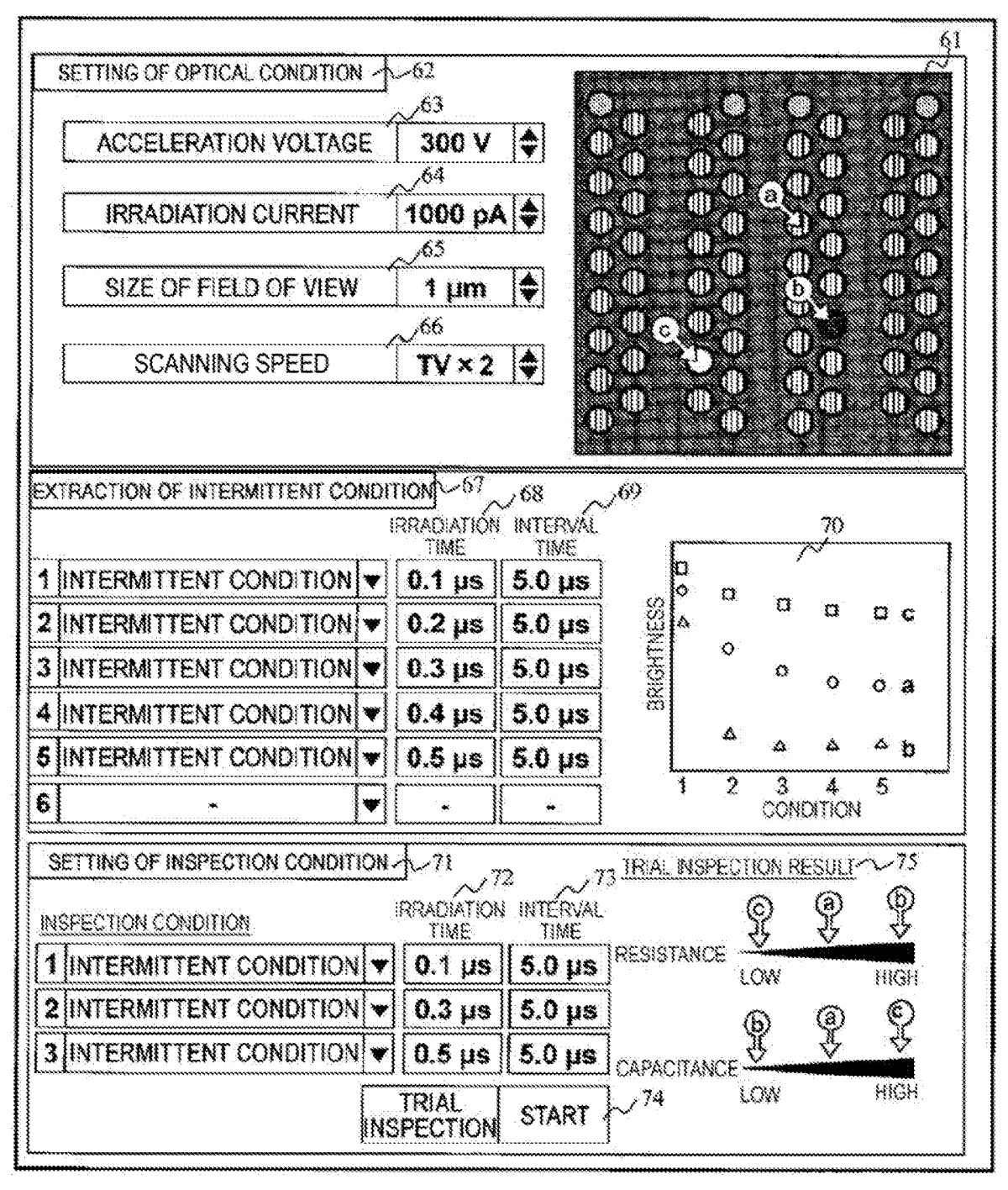

FIG. 13 shows an operation interface in the inspection recipe setting process used in the present embodiment. The operation interface has the same configuration as that shown in FIG. 4. In the present embodiment, a pattern a, a pattern b, and a pattern c are selected as targets to be inspected in the inspection pattern setting unit 61. In addition, in the acceleration voltage setting unit 63, the irradiation current setting unit 64, the field-of-view size setting unit 65, and the scanning speed setting unit 66, the acceleration voltage is set to 300 V, the irradiation current is set to 1000 pA, the size of the field of view is set to 1 µm, and the scanning speed is set to a rate that is two times a TV rate.

In the present embodiment, five intermittent conditions are set in the irradiation setting unit 68 and the inter-irradiation point setting unit 69. As the intermittent conditions, the irradiation times are set to 0.1, 0.2, 0.3, 0.4, and 0.5 µs, respectively, and all the blocking times are set to 5.0 µs. When a decrease in brightness is saturated, the irradiation time $T_s$ is 0.5 µs, and the brightness $S_s$ during saturation can be extracted from each of the pattern a, the pattern b, and the pattern c in the brightness analysis result display unit 70.

In the present embodiment, in the inspection condition setting unit 71, a first intermittent condition used for the inspection is set so that an irradiation time is 0.1 µs and a blocking time is 5.0 µs, a second intermittent condition is set so that an irradiation time is 0.3 µs and a blocking time is 5.0 µs, and a third intermittent condition is set so that an irradiation time is 0.5 µs and a blocking time is 5.0 µs.

The electrical resistance R is analyzed based on Expression from the brightness obtained under the third intermittent condition. In the present embodiment, the corrected brightness is calculated using a correction expression of Expression 6, and a first RC time constant is analyzed based on Expression 4 using a difference in corrected brightness between the image acquired under the first intermittent condition and the image acquired under the second intermittent condition. The capacitance C can be analyzed using Expression 5 from the electrical resistance R and the RC time constant.

In the present embodiment, the flowchart of the inspection process of classifying defects shown in FIG. 5 is used. In the present embodiment, the operation interface of the defect inspection process shown in FIG. 9 is used. Under the inspection conditions set in the inspection recipe setting process, the plug 101 as a normal plug, the plug 102 as a defective plug, and the plug 103 as a defective plug can be classified and inspected.

In the embodiment described above, by correcting the brightness according to the electrical characteristics, the electrical resistance R and the capacitance C of a defect can be analyzed with high accuracy. Therefore, the accuracy of defect classification is improved.

Embodiment 4

In the present embodiment, regarding a defect inspection apparatus that classifies and inspects defects of a sample having different electrical characteristics using an image of a scanning electron microscope, a scanning electron microscope having a function of correcting the brightness according to electrical characteristics and independently analyzing the electrical resistance R and the capacitance C of defects with high accuracy from brightness of images acquired under a plurality of intermittent conditions will be described.

In the present embodiment, the scanning electron microscope shown in FIG. 1 is used. FIG. 14 is a cross-sectional view of a sample used in the present embodiment. A plug 121 is in contact with an impurity diffusion layer 124 formed on a part of a silicon substrate 125 from which an element is separated. A plug 122 is a defective plug that is not in contact with the impurity diffusion layer 124. A plug 123 is a defective plug in which two adjacent plugs are electrically connected. In the present embodiment, the normal plug and the two types of defective plugs are classified and inspected.

FIG. 15 is a flowchart showing an inspection recipe setting process of correcting the brightness according to electrical characteristics and independently analyzing the electrical resistance R and the capacitance C of defects with high accuracy in the present embodiment.

First, a sample moves to an observation place (S161). Next, a layout of a sample to be inspected is designated (S162). Here, the layout is a layout of a repeated pattern region of a semiconductor wafer. Next, the sample moves to a trial inspection region used for generating the recipe using layout information (S163). Next, an optical condition is set (S164). Here, the optical condition includes an acceleration voltage of an electron beam, an irradiation current of an electron beam, and a scanning speed. Next, a size of a field of view of observation or an observation magnification is set (S165). Next, a plurality of intermittent conditions are set and an image is acquired (S166). The plurality of intermittent conditions set in S166 are different from each other in at least one condition among the irradiation time, the irradiation distance, the blocking time, or the inter-irradiation point distance. Further, the plurality of intermittent conditions set in S166 have at least two different irradiation times and at least two different blocking times.

Next, brightness of images acquired under a plurality of intermittent conditions is analyzed (S167). Next, the electrical resistance R is analyzed based on a saturated brightness value at which the brightness of the image is saturated at a plurality of irradiation times (S168). Next, the correction value of the brightness of the image relative to a residual charge is calculated based on the saturated brightness value at a plurality of irradiation times (S169). Next, the capacitance C is analyzed from the corrected brightness corrected using the correction value relative to a residual charge (S170). Next, the results of the intermittent conditions and the brightness of the image or the electrical resistance R and the capacitance C obtained in the trial inspection are displayed (S171). Next, two or more intermittent conditions used for the inspection are set (S172). In the present embodiment, the user manually sets the intermittent conditions. However, the apparatus may automatically determine and set the intermittent conditions from the intermittent conditions used. Next, the inspection recipe generation process ends (S173).

FIG. 16 shows the correction result of the brightness of the image relative to a residual charge in S169 in the present embodiment. In the sample according to the present embodiment, charging is saturated at an electron beam irradiation time of 0.1 µs. In addition, in the present embodiment, a leakage current flowing due to an internal electric field of the sample during charging is not considered. The time change of the brightness S represents charge accumulation characteristics by electron beam irradiation and can be represented by Expression 7.

$$S = S_0 \times e^{-Tir/\tau}$$ [Expression 7]

Here, $S_0$ represents brightness at an irradiation time Tir of 0, Tir represents an irradiation time, $\tau$ represents a time constant of charge accumulation, and $S_0$ can be represented by Expression 7 when approximated to a line of the blocking time Ti.

$$S_0 = S_{max} \times \frac{Ti}{T_{S2}} (0 \leq Ti \leq T_{S2})$$ [Expression 8]

Here, $T_{s2}$ corresponds to a blocking time when the blocking time increases such that an increase in brightness is saturated, and $S_{max}$ is $S_0$ at the blocking time $T_{s2}$. The corrected brightness $S_C$ relative to a residual charge can be obtained from Expression 9 representing a time change in brightness when there is no residual charge.

$$S_C = S_{max} \times e^{-Tir/\tau}$$ [Expression 9]

Further, the corrected brightness $S_C$ can be obtained from Expression 10 based on Expression 7, Expression 8, and Expression 9.

$$S_C = S \times \frac{T_{S2}}{Ti}$$ [Expression 10]

A variable value based on the influence of residual charge is corrected by calculation using Expression 10. As shown in a time change in brightness and a corrected brightness 131 obtained at a first blocking time and in a time change in brightness and a corrected brightness 132 obtained at a second blocking time, the residual charge depending on the blocking time is corrected, and the corrected brightness values are the same at the first blocking time and the second blocking time.

FIG. 17 shows an operation interface in the inspection recipe setting process used in the present embodiment. The operation interface has the same configuration as that shown in FIG. 4. In the present embodiment, a pattern a, a pattern b, and a pattern c are selected as targets to be inspected in the inspection pattern setting unit 61. In addition, in the acceleration voltage setting unit 63, the irradiation current setting unit 64, the field-of-view size setting unit 65, and the scanning speed setting unit 66, the acceleration voltage is set to 300 V, the irradiation current is set to 1000 pA, the size of the field of view is set to 1 µm, and the scanning speed is set to a rate that is two times a TV rate.

In the present embodiment, as setting units of a plurality of intermittent conditions, the operation interface includes: an irradiation time setting unit 141 that inputs a variable range of an irradiation time and a variable step thereof; and a blocking time setting unit 141 that inputs a variable range of a blocking time and a variable step thereof.

When an increase in brightness is saturated, the blocking time $T_{s2}$ is 3.0 µs, and the amount of correction by residual charge can be extracted from each of the pattern a, the pattern b, and the pattern c in a brightness analysis result display unit 144 of the blocking time. The capacitance C can be analyzed from the corrected brightness obtained from Expression 10 and Expression 3.

In the present embodiment, the flowchart of the inspection process of classifying defects shown in FIG. 5 is used. In the present embodiment, the operation interface of the defect inspection process shown in FIG. 9 is used. Under the inspection conditions set in the inspection recipe setting process, the plug 121 as a normal plug, the plug 122 as a defective plug, and the plug 123 as a defective plug can be classified and inspected.

In the embodiment described above, by correcting the brightness according to the electrical characteristics, the electrical resistance R and the capacitance C of a defect can be analyzed with high accuracy. Therefore, the accuracy of defect classification is improved.

Embodiment 5

As described above, a change in brightness (for example, a signal amount at a specific position) depending on a change in beam irradiation condition varies depending on electrical characteristics corresponding to the defect type. That is, a change in brightness obtained when a beam is irradiated under a plurality of beam irradiation conditions depends on electrical characteristics such as the defect type or the characteristic amount of a defect. For example, it can be said that there is a correlation between a combination of the irradiation conditions and characteristic amounts (or image data itself) obtained from a plurality of images and electrical characteristics.

Therefore, in the present embodiment, a system that outputs electrical characteristics by inputting a plurality of irradiation conditions and at least one of image data acquired by beam irradiation under the irradiation conditions, characteristic amounts extracted from the image data, and information such as the S-curve into a learning device will be described, the learning device executing learning in advance using teacher data including a plurality of irradiation conditions, image data acquired by beam irradiation under the irradiation conditions, characteristic amounts extracted from the image data, or information such as the S-curve generated from the characteristic amounts as an input and including electrical characteristics as an output.

FIG. 20 is a diagram showing one example of an electrical characteristic estimation system. FIG. 20 is a functional block diagram. A computer system 2001 shown in FIG. 20 is a machine learning system, includes one or more processors, and is configured to execute one or more arithmetic modules stored in a predetermined storage medium. In addition, an estimation process described below may be performed using an AI accelerator. The computer system 2001 shown in FIG. 20 includes an input unit 2004 to which includes the teacher data provided for learning or data required for the estimation process is input from a storage medium 2002 or an input device 2003.

A learning unit 2005 built in the computer system 2001 receives, as the teacher data, a combination of at least one of image data input from the input unit 2004 and a characteristic of an image extracted from an image processing apparatus (not shown), abeam irradiation condition of the charged particle beam apparatus, and electrical characteristic information of an element formed on a sample. The characteristic of the image is, for example, brightness or a contrast of a specific pattern and can be obtained by extracting brightness information of a pattern specified by pattern matching or the like or a specific pattern segmented by semantic segmentation or the like. As the learning device, for example, a neural network, a regression tree, or a Bayes identifier can be used.

In addition, the beam irradiation condition is a blocking time or an irradiation time of a pulsed beam as described in the previous embodiment. The learning unit 2005 reads the inspection recipe from the charged particle beam apparatus or receives an input from the input device 2006 to receive this data as a part of the teacher data. The electrical characteristic information is, for example, a value obtained by simulation, a value actually measured by an EB tester or the like, a value obtained from an image that is obtained based on cross-sectional processing observation of an actual device, or a value corresponding to the defect type based on an experience of an operator, and the learning unit 2005 receives at least one piece of the information as a label.

The learning unit 2005 executes machine learning using the received teacher data. A learning model storage unit 2007 stores a learning model that is constructed by the learning unit 2005. The learning model constructed by the learning unit 2005 is transmitted to an electrical characteristic estimation unit 2008 and is used for estimating electrical characteristics.

In the electrical characteristic estimation unit 2008, based on the learning model constructed by the learning unit 2005, electrical characteristics are estimated from the beam irradiation condition and at least one of the image data and the characteristic extracted from the image data. As described in the previous embodiment, a variation of the characteristic that can be recognized on the image when the beam irradiation condition is changed depends on the type of electrical characteristics or the parameter of electrical characteristics. Therefore, by allowing the learning device to execute learning using the electrical characteristic information and a data set of the image data or the like and the beam irradiation condition in advance, the electrical characteristic can be estimated using the learning device.

The estimation result can be stored in an estimation result storage unit 2009 or can be displayed on a display device included in an input device.

The teacher data can include at least one of the electrical resistance and the capacitance. Further, it is also thought that comparison information (for example, size information relative to a standard value) of the electrical resistance or the capacitance is included in teacher data.

FIG. 25 shows input data in the present embodiment. B represents a pattern having a reference electrical resistance and a reference capacitance, and A, C, D, and E are patterns having electrical characteristics different from that of B. In the four patterns A, C, D, and E, two defect types including a capacitance defect and an electrical resistance defect are mixed. In the present embodiment, regarding the five patterns including A, C, D, E, and B, by inputting brightness at a plurality of blocking times (times at which a pulsed beam is not irradiated), two defect types including a capacitance defect and an electrical resistance defect are classified. The input brightness is an average brightness in an image region specified by pattern matching or the like. The learning device executes machine learning by using regression analysis in which Expression 1, Expression 3, and Expression 4 are used as model formulae and a neural network that weights the regression analysis results in combination. As a result of the machine learning, the patterns A and C are output as capacitance defects, and D and E are output as electrical resistance defects. The output result matches the classification result of an image obtained based on cross-sectional processing observation of an actual device.

In the above-described embodiment, the system that outputs electrical characteristics by inputting a plurality of irradiation conditions and at least one of image data acquired by beam irradiation under the irradiation conditions and characteristic amounts extracted from the image data can be provided, and the defect type can be classified.

Embodiment 6

(a) of FIG. 21 is a cross-sectional view showing a simple configuration of a transistor to be evaluated by the charged particle beam apparatus or the like. Diffusion layers 2102 and 2103 are stacked on a well 2101, and a gate electrode 2105 is formed over the diffusion layers 2102 and 2103 through a gate oxide film 2104. In addition, a side wall 2106 is formed on a side wall of the gate electrode 2105. Further, an electrode (a source contact 2108 (first terminal), a gate contact 2109 (second terminal), and a drain contact 2110 (second terminal)) in contact with each of the diffusion layer 2102, the gate electrode 2105, and the diffusion layer 2103 is formed with an interlayer oxide film 2107 interposed therebetween.

(b) to (d) of FIG. 21 are diagrams showing the types of defects of the transistor shown in (a) of FIG. 21. (b) of FIG. 21 shows a state (open defect) where the gate electrode 2105 and the gate contact 2109 that are supposed to be connected to each other are not connected. (c) of FIG. 21 shows a state (gate leakage defect) where a current leaks from the gate electrode 2105. (d) of FIG. 21 shows a state (junction leakage defect) where a current leaks from the diffusion layer.

The system or the like for specifying a defect of a semiconductor element will be described below. FIG. 22 is a flowchart showing an inspection process. In the present embodiment, an example of executing inspection based on image acquisition using the scanning electron microscope shown in FIG. 1 will be described. In the present embodiment, in order to specify the defect type, an image is formed based on beam irradiation on a region including a plurality of patterns (in the present embodiment, the source contact 2108, the gate contact 2109, and the drain contact 2110 (hereinafter, also referred to as a plug))).

As in Step 106 of FIG. 3, images are formed by beam irradiation at a plurality of blocking times (Steps 2201 and 2202), a set number of images (blocking conditions) are acquired, and characteristics are extracted from the acquired plurality of images (Step 2203). Here, the characteristic is, for example, a contrast relative to brightness of the plug or reference brightness.

The left of (a) of FIG. 23 shows one example of images of a plurality of plugs having no defects. Three patterns that are aligned represent the source contact, the gate contact, and the drain contact, in order from the left. When a beam is irradiated under a beam irradiation condition A (an irradiation condition where charge is more likely to be accumulated than a beam irradiation condition B described below; for example, a pulsed beam having a shorter blocking time than that of the beam irradiation condition B), the charge is accumulated and the brightness is low in the gate contact at the center. A pattern indicated by an oblique line shows a state where the brightness is lower than that in a white pattern. On the other hand, when charge is accumulated in the gate contact, the gate is opened. Therefore, the source contact and the drain contact are electrically connected, and the brightness of the left and right plugs is high.

On the other hand, when a transistor having no defects is irradiated with a beam under the beam irradiation condition B (an irradiation condition where charge is less likely to be accumulated than the beam irradiation condition A), images are obtained as shown in the right of (a) of FIG. 23. Due to the beam irradiation condition where charge is less likely to be accumulated, the brightness of the gate contact is high, but the gate is closed. Therefore, charge is accumulated and the brightness is low in the source contact and the drain contact.

The left of (b) of FIG. 23 is a diagram showing an image example that is obtained when a plurality of patterns including a plug having an open defect are irradiated with the beam under the beam irradiation condition A. In the case of the open defect, even when the gate contact is irradiated with the beam, the gate is not opened and the gate contact is also insulated. Therefore, the brightness of all the patterns is low. On the other hand, the right of (b) of FIG. 23 is a diagram showing an image example that is obtained when a plurality of patterns including a plug having an open defect are irradiated with the beam under the beam irradiation condition B. Due to the beam irradiation condition where charge is less likely to be charged, the brightness of the gate contact is high, but the gate is closed. Therefore, charge is sufficiently accumulated and the brightness is low in the source contact and the drain contact.

The left of (c) of FIG. 23 is a diagram showing an image example that is obtained when a plurality of patterns having a gate leakage defect are irradiated with the beam under the beam irradiation condition A. Since a current leaks from the gate, charge is not accumulated in the gate contact, and the brightness of the gate contact is high. Since the gate is not opened, charge is accumulated in the source contact and the drain contact, and the brightness thereof is lower than that of the gate contact. On the other hand, the right of (c) of FIG. 23 is a diagram showing an image example that is obtained when a plurality of patterns having a gate leakage defect are irradiated with the beam under the beam irradiation condition B. In the gate contact, since charge is not accumulated as shown in the left of (c) of FIG. 23, the brightness is high but the gate is closed. Therefore, charge is sufficiently accumulated and the brightness is low in the source contact and the drain contact.

The left of (d) of FIG. 23 is a diagram showing an image example that is obtained when a plurality of patterns having a junction leakage defect are irradiated with the beam under the beam irradiation condition A. In the case of the junction leakage defect, even when the source contact and the drain contact are irradiated with the beam, charge is not accumulated. Therefore, the brightness of the patterns is high. In addition, since the gate contact is normal, charge is accumulated and the brightness of the pattern is low as shown in (a) of FIG. 23. On the other hand, the right of (d) of FIG. 23 is a diagram showing an image example that is obtained when a plurality of patterns having a junction leakage defect are irradiated with the beam under the beam irradiation condition B. In the source contact and the drain contact, charge is not accumulated as shown in the left of (d) of FIG. 23, and thus the brightness thereof is high. In the gate contact, the accumulation of charge is small, and thus the brightness is higher than that shown in the left of (d) of FIG. 23.

As described above, a plurality of characteristics of a plurality of patterns forming a semiconductor element (in this example, a transistor) are combined according to defect types, the characteristics being extracted from a plurality of images acquired under different beam conditions. Accordingly, for example, characteristic combination information and defect type information are stored in the storage medium of the computer system 2001 in association with each other. By comparing (Step 2204) the relation information (reference information) and a plurality of characteristics extracted from the acquired plurality of images to each other, the defect type can be specified (Step 2205). For example, the relation information is a table that defines a defect type and a combination of characteristics. By referring to the table for a plurality of characteristics, a defect type having characteristics that match or are most similar to the characteristics may be selected.

In addition, instead of the absolute value of brightness, a relationship between a relationship of brightness of a plurality of patterns and defect types may be stored as a library, and a defect type may be specified by referring to the library.

In the description of a defect type or characteristics, some examples have been merely introduced. However, the method of specifying a defect type using the information describing the relationship between defect types and characteristics of a plurality of patterns obtained under a plurality of beams having different charging conditions is also applicable, for example, to specify other defect types.

The defect type described in the present embodiment can also be estimated using the learning device shown in FIG. 20. For example, it is thought that a learning model that learns in advance is prepared, in which a plurality of beam irradiation conditions, plural pieces of image data obtained under a plurality of beam conditions, or a combination of characteristics extracted from patterns and defect types are teacher data, and a defect type is estimated by inputting beam irradiation conditions, plural pieces of image data, or characteristic amount combination information into the learning model.

Embodiment 7

The transistor shown in FIG. 21 is an element that applies a voltage to a gate to adjust a current flowing between a source and a drain. One method of process control of a semiconductor device is a method of controlling input/output characteristics that is a relationship between an input and an output when the input is a voltage applied to the element and the output is a current flowing through the element. In the present embodiment, a computer system that inspects input/output characteristics of a semiconductor element will be described.

Figure 24A:
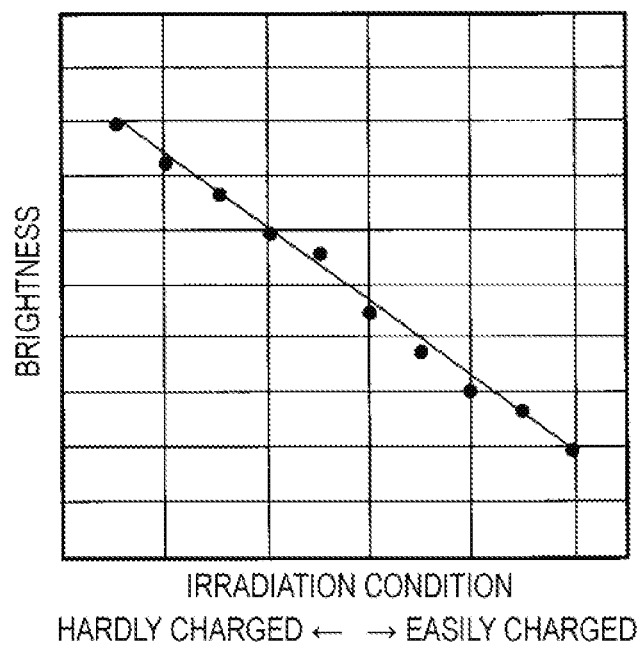
FIGS. 24A and 24B are graphs showing a change of brightness of a pattern when the beam irradiation condition is changed.
Figure 24B:
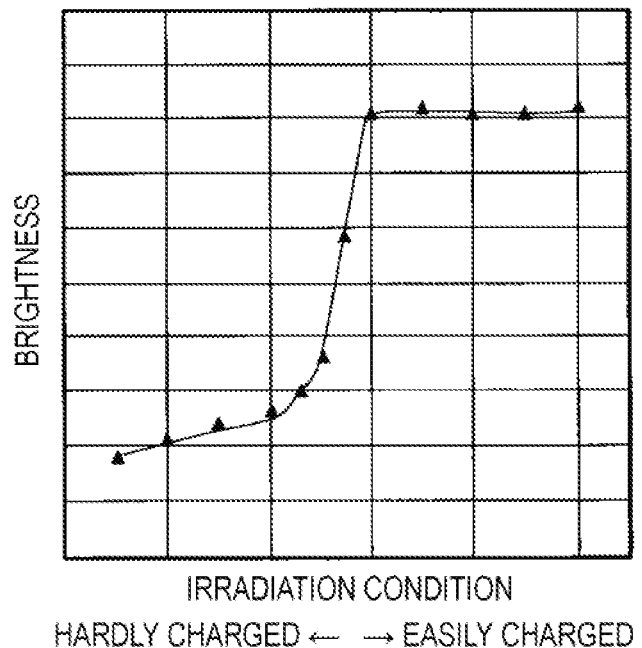

FIG. 24 is a graph in which the brightness of a plug is plotted, the brightness being specified from images acquired by beam irradiation under a plurality of beam conditions. In the present embodiment, the charge accumulation state is adjusted by changing the blocking time of a pulsed beam. (a) of FIG. 24 shows the transition of the brightness of a gate contact, and (b) of FIG. 24 shows the transition of the brightness of a source contact or a drain contact. The brightness of (a) of FIG. 24 is inversely proportional to a voltage applied to the gate, and the brightness of (b) of FIG. 24 is proportional to a current flowing between the source and the drain. Therefore, a combination of (a) and (b) of FIG. 24 is one form representing the input/output characteristics.

In (a) of FIG. 24, as the amount of charge accumulated increases, the brightness decreases. On the other hand, in (b) of FIG. 24, the brightness rapidly increases from a given amount of charge accumulated. A rapid increase in brightness in (b) of FIG. 24 shows a change from a state where the gate is closed to a state where the gate is opened. The processor included in the computer system generates a curve (information generated from a plurality of characteristics) representing a change in brightness relative to a change in image acquisition condition and specifies a rapid change point in brightness, so that a gate threshold voltage that is one index representing input/output characteristics can be specified.

In the computer system, for example, the displacement point is specified based on differential processing of a waveform, and the gate threshold is compared to previously registered reference information of a non-defective product or a defective product to determine whether or not the gate threshold is appropriate. Specifically, for example, a threshold range (range of a beam irradiation condition) where a non-defective product can be obtained is stored in a predetermined storage medium in advance, and whether the product is non-defective or defective is determined based on whether or not the displacement point is included in the range. In addition, an S-curve (the curve shown in Fig. (b) of 24) of a non-defective product or a defective product is previously registered as reference data, and whether or not the product is non-defective or defective may be determined by fitting the inspection result to the reference data. In addition, relation information regarding a relationship between a beam condition and a gate threshold voltage is stored in advance, and a gate threshold may be calculated by referring to the relation information for the displacement point.

In the present embodiment, input/output characteristics of an element formed on a semiconductor device can be evaluated.

In the present embodiment, the transistor such as MOS-FET has been described as an example. However, the above-described method is applicable to an operation test of a memory (other switching elements) such as STT-MRAM. Specifically, input/output characteristics of a STT-MRAM such as a switching speed, a drive current, or a write/erase threshold may be obtained from the transition of the brightness of a contact plug obtained when a magnetic tunnel junction element of STT-MRAM is irradiated with a beam under a plurality of irradiation conditions.

In addition, input/output characteristics can be estimated using the learning device shown in FIG. 20. For example, it is thought that a learning model that learns in advance is prepared, in which a plurality of beam irradiation conditions, plural pieces of image data obtained from a plurality of beam conditions, or a combination (S-curve) of characteristics extracted from patterns and input/output characteristic information are teacher data, and input/output characteristics is estimated by inputting beam irradiation conditions, plural pieces of image data, or a S-curve into the learning model.

1: electron beam source
2: condenser lens
3: diaphragm
4: pulsed electron generator
5: deflector
6: objective lens
8: detector
9: output adjustment circuit
10: sample stage
11: sample
21: acceleration voltage controller
22: irradiation current controller
23: pulse irradiation controller
24: deflection controller
25: focusing controller
26: sample electric field controller
27: stage position controller
28: control transmitter
30: control transmitter
31: detection signal processing unit 32: detection signal analysis unit
33: image or electrical characteristic display unit
34: database
41: operation interface
51: plug
52: plug
53: silicon substrate
54: plug
55: plug
61: inspection pattern setting unit
62: optical condition/scanning condition/field of view setting unit
63: acceleration voltage setting unit
64: irradiation current setting unit
65: field-of-view size setting unit
66: scanning speed setting unit
67: intermittent condition extraction unit
68: irradiation setting unit
69: inter-irradiation point setting unit
70: brightness analysis result display unit
71: inspection condition setting unit
72: irradiation setting unit used for inspection
73: inter-irradiation point setting unit used for inspection
74: trial inspection execution unit
75: trial inspection result display unit
81: inspection region setting unit
82: inspection execution unit
83: defect classification setting unit
84: defect a group generating distribution display unit
85: defect b group generating distribution display unit
86: defect group generating distribution display unit
91: plug
92: silicon substrate
93: impurity diffusion layer
94: plug
95: plug
96: plug
101: plug
102: plug
103: plug
104: wiring
105: wiring
106: silicon substrate
111: time change of brightness obtained at first irradiation time
112: time change of brightness obtained at second irradiation time
113: time change of brightness obtained at third irradiation time
114: time change of brightness obtained at first to third irradiation times
115: time change of corrected brightness
121: plug
122: plug
123: plug
1124: impurity diffusion layer
125: silicon substrate
131: time change in brightness and corrected brightness obtained at first blocking time
132: time change in brightness and corrected brightness obtained at second blocking time
141: irradiation time setting unit
142: blocking time setting unit
143: brightness analysis result display unit of irradiation time
144: brightness analysis result display unit

The invention claimed is:

1. A system comprising:
a charged particle beam apparatus that acquires an image of a sample;
a computer system that includes one or more processors and is configured to be communicable with the charged particle beam apparatus; and
a memory that stores relation information between information regarding two or more characteristics and electrical characteristics of an element formed on a sample are associated with each other, the characteristics being extracted from at least two or more pieces of image data acquired from the charged particle beam apparatus under at least two image acquisition conditions,
the relation information is an arithmetic expression for the two or more characteristics based on an electrical resistance, a capacitance, and the at least two image acquisition conditions,
wherein the processor
receives information regarding two or more characteristics of a specific pattern that is included in a plurality of images acquired from the charged particle beam apparatus under at least two different image acquisition conditions including at least one of a blocking time between irradiations of the sample by a beam and an irradiation time of the beam when the sample is irradiated with the beam using the charged particle beam apparatus in a pulsatile manner, and
calculates, from the arithmetic expression, one of the electrical resistance and the capacitance based on another one of the electrical resistance and the capacitance, the information regarding two or more characteristics, and the at least two image acquisition conditions.

2. The system according to claim 1,
wherein the processor classifies a type of a defect of the element based on a calculation result.

3. The system according to claim 2,
wherein the processor outputs a distribution of the defect or an average defect destiny in the sample based on the calculation result.

4. The system according to claim 2,
wherein the type of the defect includes an electrical resistance defect and a capacitance defect.

5. The system according to claim 1,
wherein the processor calculates the electrical resistance or the capacitance based on the following first arithmetic expression:

$$\Delta S \propto \frac{C}{Q(Tir)} \left( e^{-Ti1/RC} - e^{-Ti2/RC} \right) \qquad \text{[Expression 1]}$$

ΔS: difference between two characteristics
C: capacitance
R: electrical resistance
Q: charge accumulated by beam irradiation
Ti1: first beam blocking time of pulsed beam that is first image acquisition condition
Ti2: second beam blocking time of pulsed beam that is second image acquisition condition.

6. The system according to claim 5,
wherein the processor calculates the capacitance C by acquiring the electrical resistance R based on the following second arithmetic expression and substituting the acquired electrical resistance R into the first arithmetic expression:

$$S \propto \frac{V_S}{R} \quad \text{[Expression 2]}$$

Vs: surface voltage when charge is saturated
S: characteristic.

7. The system according to claim 5,
wherein the processor calculates the electrical resistance R by acquiring the capacitance C based on the following third arithmetic expression and substituting the acquired capacitance C into the first arithmetic expression:

$$S \propto \frac{C}{Q(Tir)} \quad \text{[Expression 3]}$$

Tir: beam irradiation time
S: characteristic.

8. The system according to claim 1,
wherein the memory stores relation information between a change of a plurality of beam conditions having different blocking times and different irradiation times and a change of the characteristics.

9. A non-transitory computer-readable medium storing a program configured to instruct a processor
to receive relation information between information regarding two or more characteristics and electrical characteristics of an element formed on a sample, the characteristics being extracted from at least two pieces of image data acquired from a charged particle beam apparatus under at least two image acquisition conditions including at least one of a blocking time between irradiations of the sample by a beam and an irradiation time of the beam when the sample is irradiated with the beam using the charged particle beam apparatus in a pulsatile manner, the relation information being an arithmetic expression for the two or more characteristics based on an electrical resistance, a capacitance, and the at least two image acquisition conditions, and
to calculate, from the arithmetic expression, one of the electrical resistance and the capacitance based on another one of the electrical resistance and the capacitance, the information regarding two or more characteristics, and the at least two image acquisition conditions.

10. The non-transitory computer-readable medium according to claim 9,
wherein the program is configured to instruct the processor to classify a type of a defect of the element based on a calculation result.

11. The non-transitory computer-readable medium according to claim 9,
wherein the program is configured to instruct the processor to output a distribution of the defect or an average defect destiny in the sample based on the calculation result.

12. A system for estimating electrical characteristics of an element formed on a sample from image data acquired from a charged particle beam apparatus, the system comprising:
a computer system; and
an arithmetic module that is executed by the computer system,
wherein the computer system includes a learning device that outputs the electrical characteristics of the element as a learning result,
the learning device executes learning in advance using teacher data including at least one among information regarding two or more characteristics extracted from two or more pieces of image data acquired from the charged particle beam apparatus under at least two image acquisition conditions including at least one of a blocking time between irradiations of the sample by a beam and an irradiation time of the beam when the sample is irradiated with the beam using the charged particle beam apparatus in a pulsatile manner, information generated from the two or more characteristics, at least two image acquisition conditions of the charged particle beam apparatus, an electrical resistance and a capacitance, and
the arithmetic module calculates one of the electrical resistance and the capacitance by inputting, to the learning device, at least one among at least two pieces of image data acquired from the charged particle beam apparatus under at least two image acquisition conditions, two or more characteristics extracted from the two or more pieces of image data, information generated from the two or more characteristics, at least two image acquisition conditions of the charged particle beam apparatus, and another one of the electrical resistance and the capacitance.

13. The system according to claim 12,
wherein the computer system classifies a type of a defect of the element based on a calculation result.

14. The system according to claim 12,
wherein the computer system outputs a distribution of the defect or an average defect destiny in the sample based on the calculation result.

15. The system according to claim 2,
wherein the element is a switching element, and the type of the defect includes at least one of an open defect in which a switching element and a terminal are not connected to each other and a leakage defect in which a current leaks from a switching element.

16. The system according to claim 1,
wherein the two or more characteristics are brightness values.

17. The non-transitory computer-readable medium according to claim 9,
wherein the two or more characteristics are brightness values.

18. The system according to claim 12,
wherein the two or more characteristics are brightness values.

* * * * *